(12) United States Patent
Midorikawa et al.

(10) Patent No.: US 7,864,614 B2
(45) Date of Patent: Jan. 4, 2011

(54) SEMICONDUCTOR MEMORY DEVICE

(75) Inventors: Tatsuro Midorikawa, Kamakura (JP);
Yasuhiko Honda, Hiratsuka (JP);
Gyosho Chin, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 12/338,041

(22) Filed: Dec. 18, 2008

(65) Prior Publication Data
US 2009/0161464 A1 Jun. 25, 2009

(30) Foreign Application Priority Data
Dec. 21, 2007 (JP) ............... 2007-331133

(51) Int. Cl.
*G11C 7/04* (2006.01)
(52) U.S. Cl. .................... 365/211; 365/185.2
(58) Field of Classification Search ............... 365/211, 365/185.2, 226
See application file for complete search history.

(56) References Cited

U.S. PATENT DOCUMENTS 6,147,908 A * 11/2000 Abugharbieh et al. .... 365/185.2
6,349,060 B1   2/2002  Ogura
6,667,904 B2 * 12/2003 Takeuchi et al. ....... 365/185.03
6,906,956 B2 *  6/2005 Marotta et al. ......... 365/185.18
7,692,418 B2 *  4/2010 Jeong ...................... 323/314

FOREIGN PATENT DOCUMENTS

| JP | 2002-170391 | 6/2002 |
|---|---|---|
| JP | 2006-65945 | 3/2006 |
| JP | 2008-83825 | 4/2008 |

* cited by examiner

*Primary Examiner*—Anh Phung
(74) *Attorney, Agent, or Firm*—Oblon, Spivak, McClelland, Maier & Neustadt, L.L.P.

(57) ABSTRACT

A semiconductor memory device includes a memory cell array which includes a plurality of memory cells which are arrayed in a matrix at intersections between a plurality of word lines and a plurality of bit lines and a power supply circuit which includes a first band gap reference circuit which outputs a first output voltage, and a second band gap reference circuit which outputs a second output voltage having lower temperature characteristics than the first output voltage on a low temperature side, and generates a power supply voltage on the basis of the second output voltage at a time of a data write operation of the memory cells.

19 Claims, 21 Drawing Sheets

Semiconductor memory device (outline)

(VREF2<VREF1 (low temperature side))

(VREF2<VREF1 (low temperature side))

Example of entire structure (first embodiment)

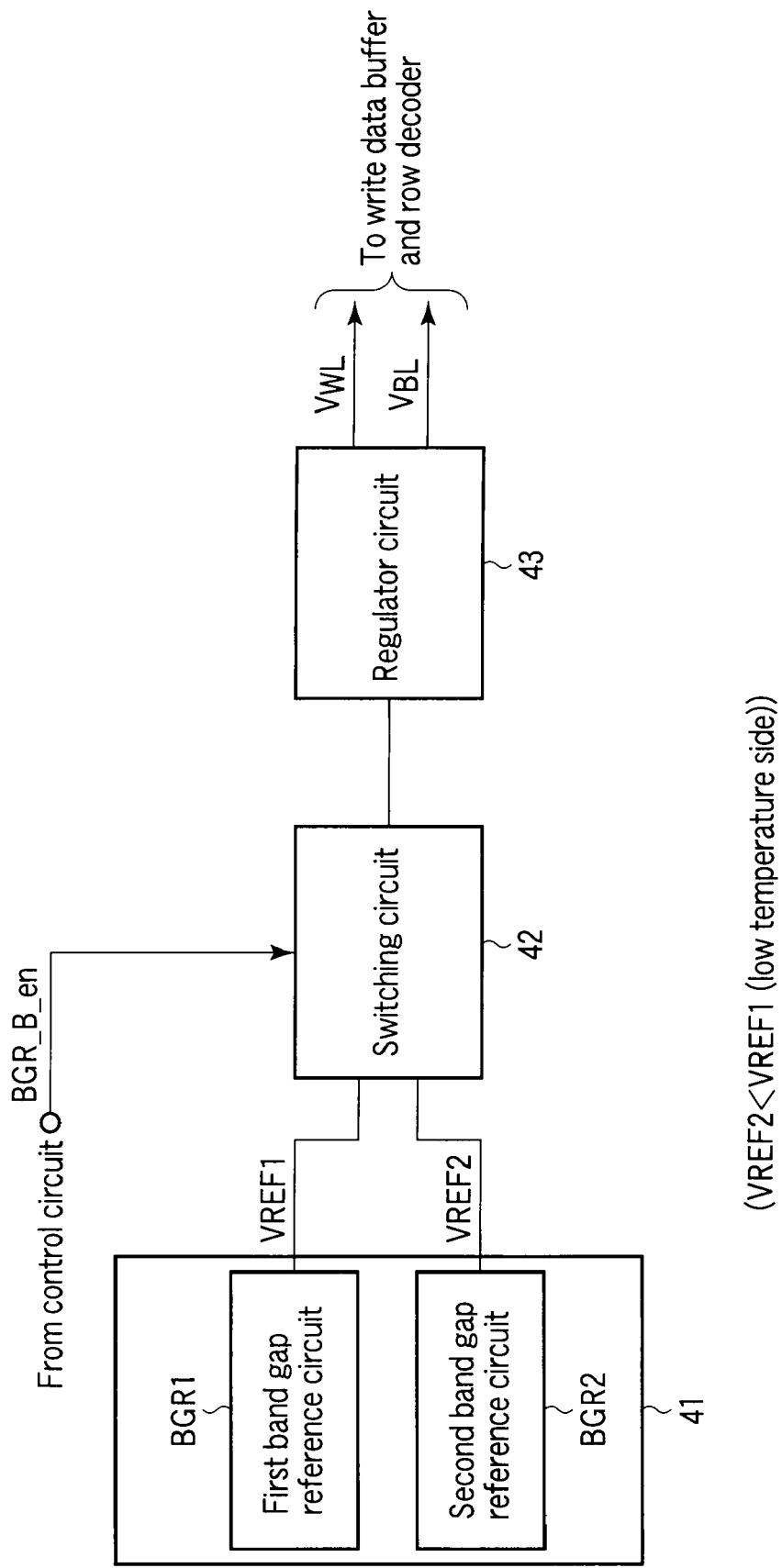
F I G. 6

First band gap reference circuit BGR1
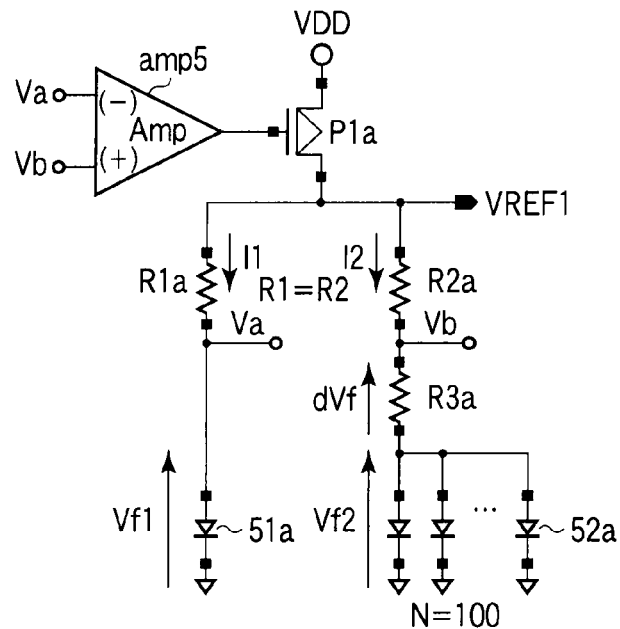
$$\begin{pmatrix} VREF1 = Vf1 + kT/q \times R2a/R3a \times \ln(N) \\ dVREF1/dT = dVf1/dT + k/q \times R2a/R3a \times \ln(N) \end{pmatrix}$$
F I G. 8
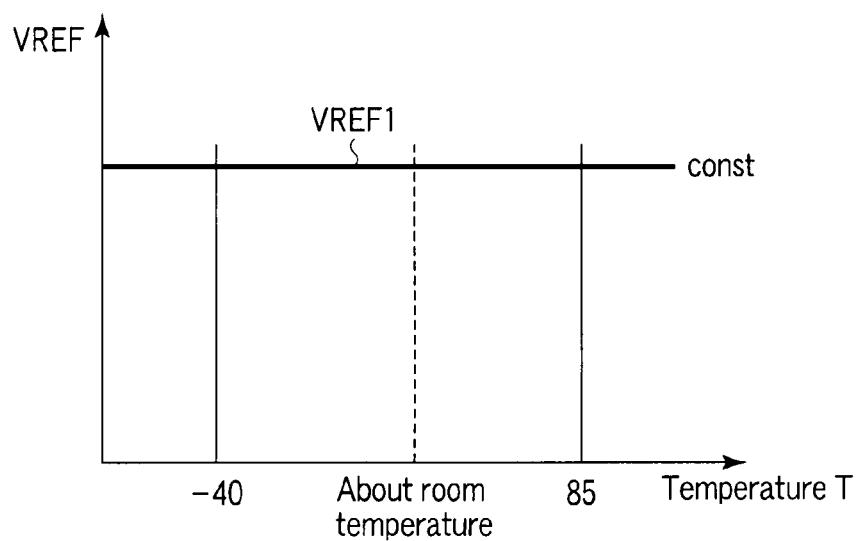
(VREF1: without temperature characteristics)
F I G. 9

VREF temperature characteristics (first embodiment)

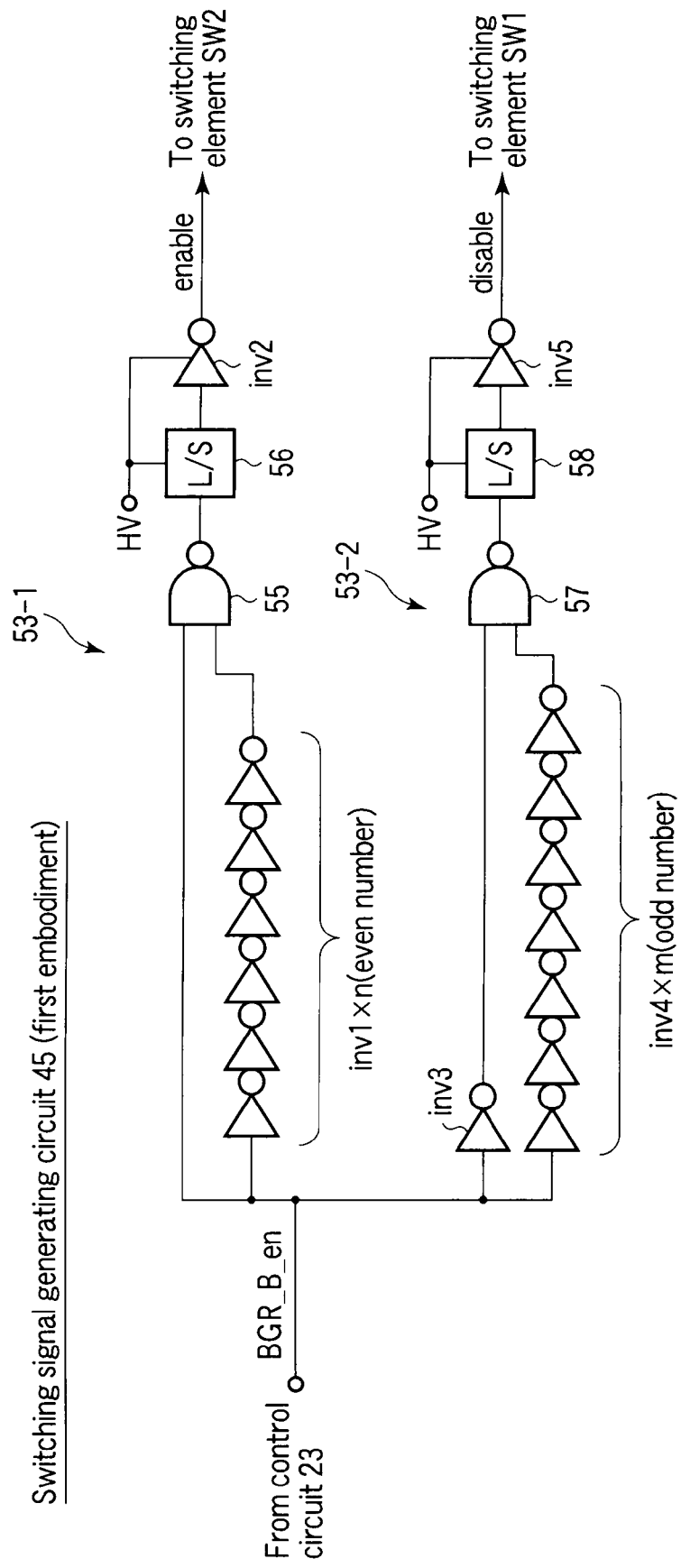
F I G. 13

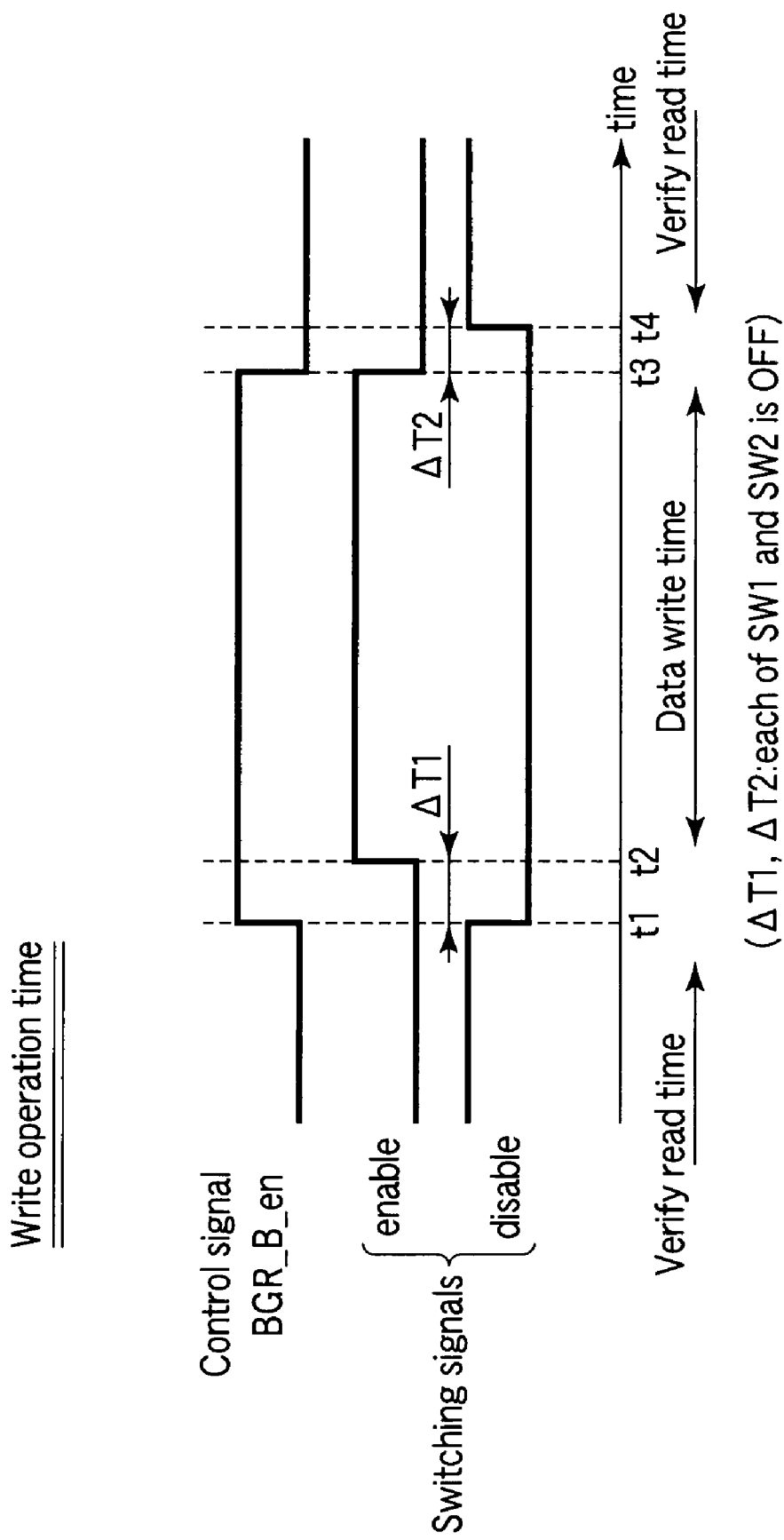
F I G. 14

Third band gap reference circuit BGR3 (second embodiment)

VREF3 temperature characteristics (second embodiment)

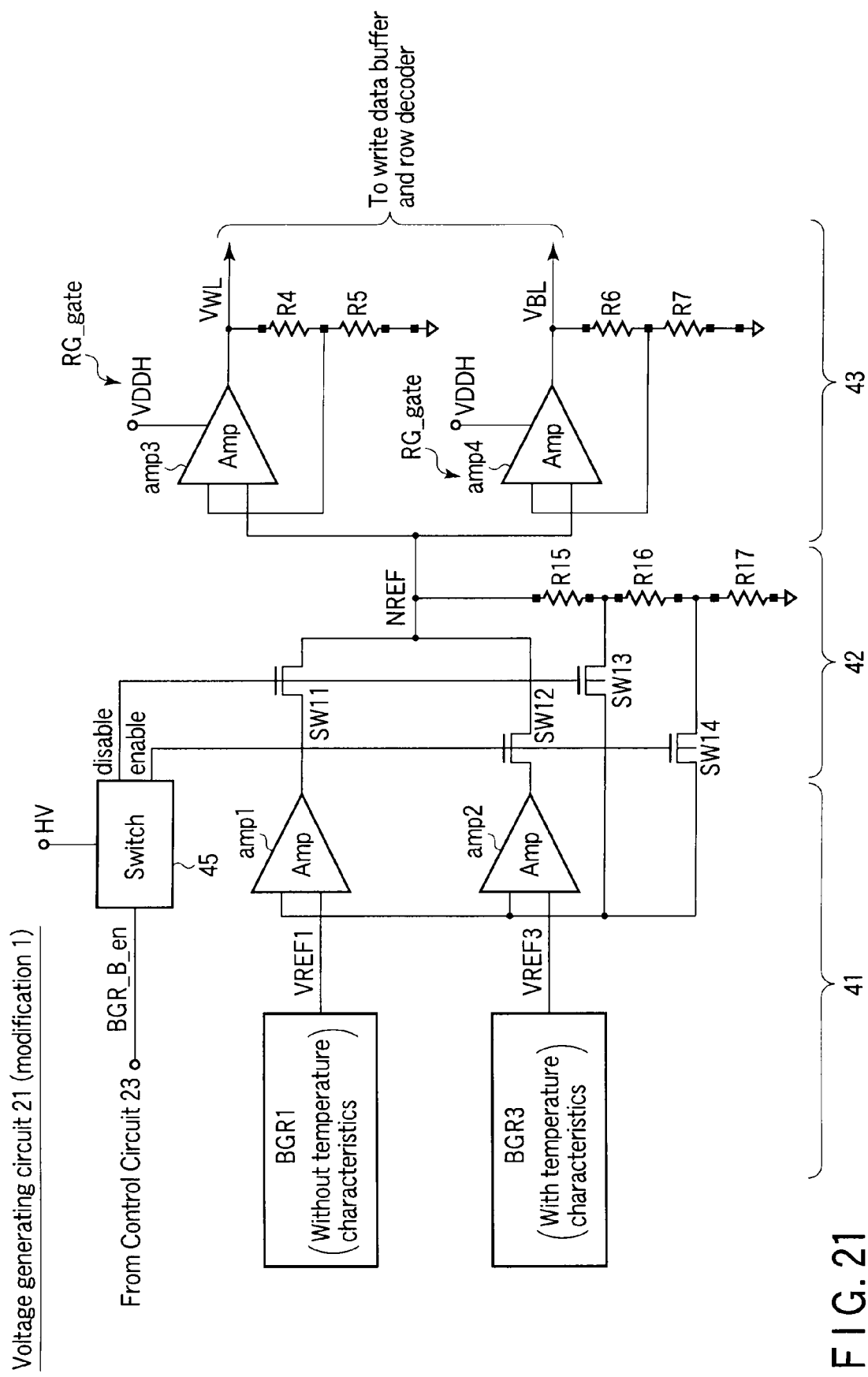
F I G. 21

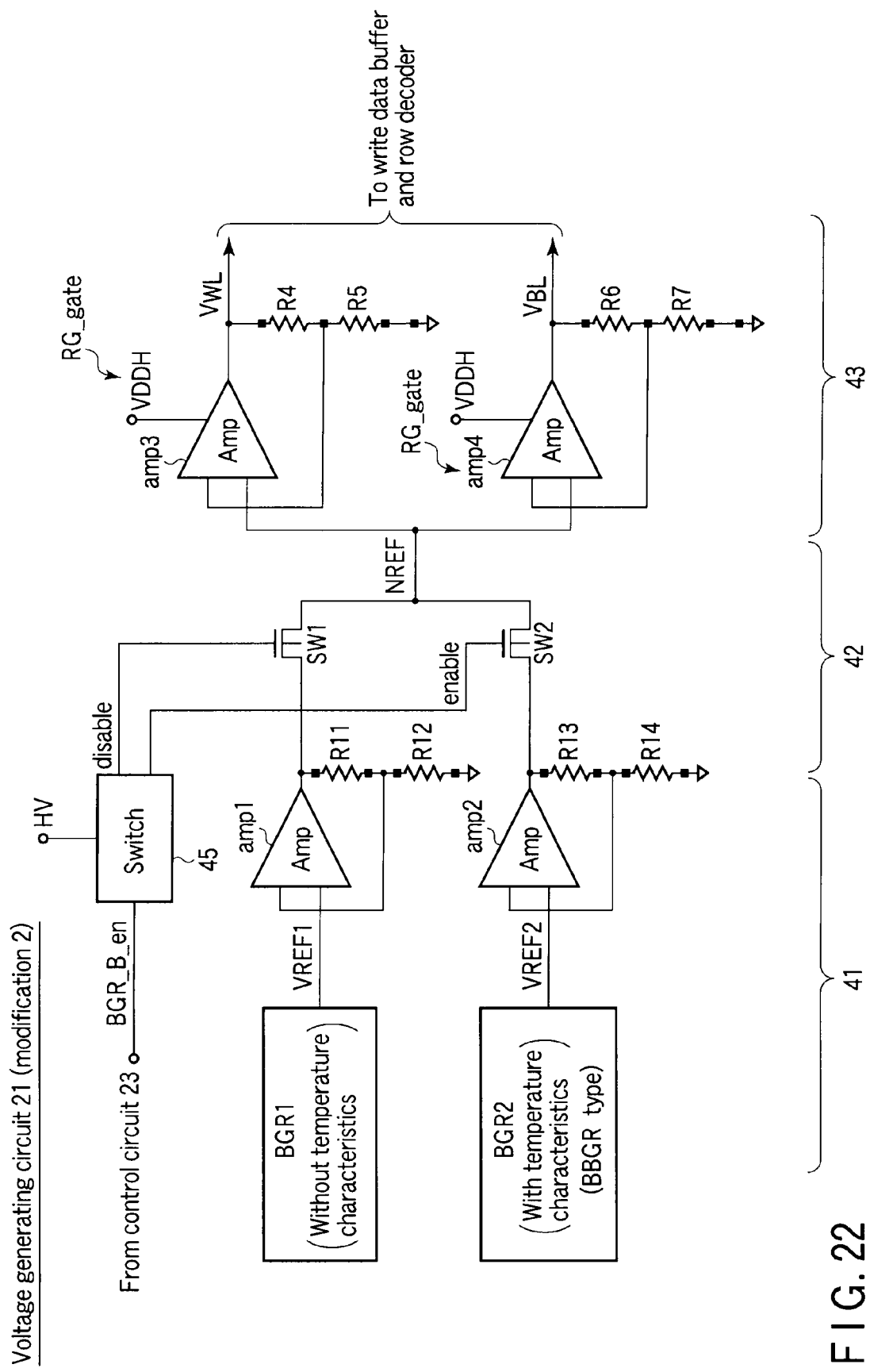
F I G. 22

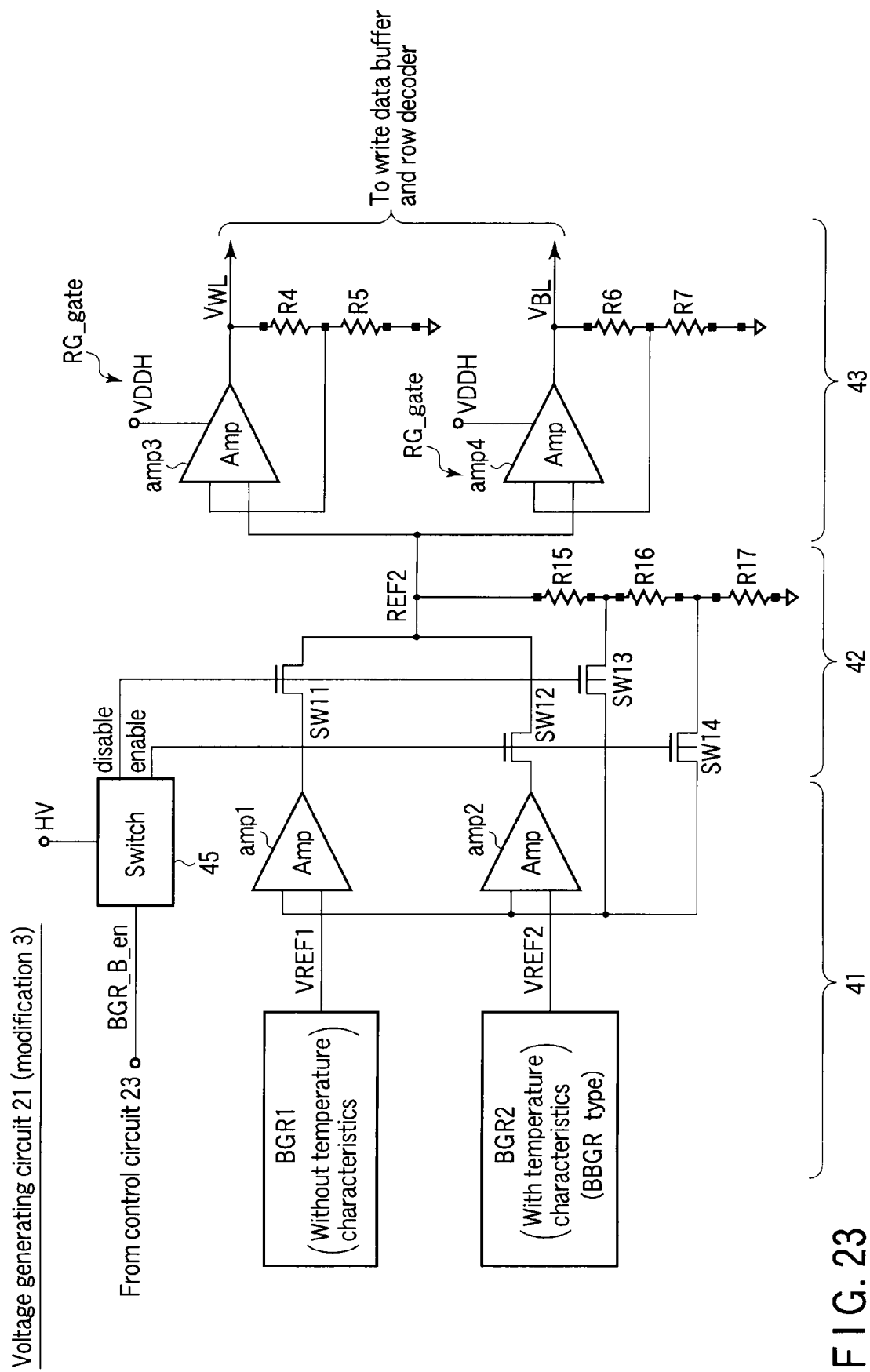
F I G. 23

SEMICONDUCTOR MEMORY DEVICE

CROSS-REFERENCE TO RELATED APPLICATIONS

This application is based upon and claims the benefit of priority from prior Japanese Patent Application No. 2007-331133, filed Dec. 21, 2007, the entire contents of which are incorporated herein by reference.

BACKGROUND OF THE INVENTION

1. Field of the Invention

The present invention relates to a semiconductor memory device.

2. Description of the Related Art

It is known that at a time of program operation of a semiconductor memory device, for instance, a NOR flash memory, cell write characteristics vary depending on temperatures (see, e.g. Jpn. Pat. Appln. KOKAI Publication No. 2002-170391). For example, on a low temperature side, the variation of threshold values is large, and so the cell write speed increases. In the prior art, however, the control for applying a gate voltage and a drain voltage is made constant in accordance with the condition of high temperatures at which the write speed is low, regardless of ambient temperatures. Consequently, there is a tendency that over-program occurs on the low temperature side on which the cell write speed at the time of the program operation increases.

Furthermore, when multi-value program is executed, it is necessary to finely control a threshold distribution of cells, and so over-program is more impermissible. It may be thinkable to set the write condition in accordance with the standard on the low temperature side on which the write speed is high. However, if the write condition is set in accordance with the standard on the low temperature side on which the write speed is high, the number of times of repetition of writes increases at high temperatures, leading to an increase in write time.

Thus, in order to avoid an increase in write time, it is necessary to vary the write voltage (gate voltage or drain voltage) or to vary the time of application of write voltage, in accordance with the variation in cell write characteristics on the low temperature side and high temperature side.

BRIEF SUMMARY OF THE INVENTION

According to an aspect of the present invention, there is provided a semiconductor memory device comprising: memory cell array which includes a plurality of memory cells which are arrayed in a matrix at intersections between a plurality of word lines and a plurality of bit lines; and a power supply circuit which includes a first band gap reference circuit which outputs a first output voltage, and a second band gap reference circuit which outputs a second output voltage having lower temperature characteristics than the first output voltage on a low temperature side, and generates a power supply voltage on the basis of the second output voltage at a time of a data write operation of the memory cells.

According to another aspect of the present invention, there is provided a semiconductor memory device comprising: a memory cell array which includes a plurality of memory cells which are arrayed in a matrix at intersections between a plurality of word lines and a plurality of bit lines; and a power supply circuit which includes a first band gap reference circuit which outputs a first output voltage, and a second band gap reference circuit which outputs a second output voltage having higher temperature characteristics than the first output voltage over a range from a low temperature side to a high temperature side, and generates a power supply voltage on the basis of the first output voltage at a time of a data write operation of the memory cells.

BRIEF DESCRIPTION OF THE SEVERAL VIEWS OF THE DRAWING

FIG. 6 is a block diagram showing a voltage generating circuit which is included in the semiconductor memory device according to the first embodiment;

FIG. 8 is an equivalent circuit diagram showing a first band gap reference circuit in FIG. 7;

FIG. 9 shows temperature characteristics of the first band gap reference circuit in FIG. 8;

FIG. 13 is an equivalent circuit diagram showing a switching signal generating circuit in FIG. 7;

FIG. 14 is a timing chart for explaining the switching of the write operation of the semiconductor device according to the first embodiment;

FIG. 21 is a block diagram showing a voltage generating circuit according to modification 1;

FIG. 22 is a block diagram showing a voltage generating circuit according to modification 2;

FIG. 23 is a block diagram showing a voltage generating circuit according to modification 3;

DETAILED DESCRIPTION OF THE INVENTION

Outline

To begin with, the outline of the present invention is described with reference to FIG. 1 and FIG. 2.

In an example of the invention, there is proposed a semiconductor memory device which can present over-program and can reduce a write time.

Figure 1:
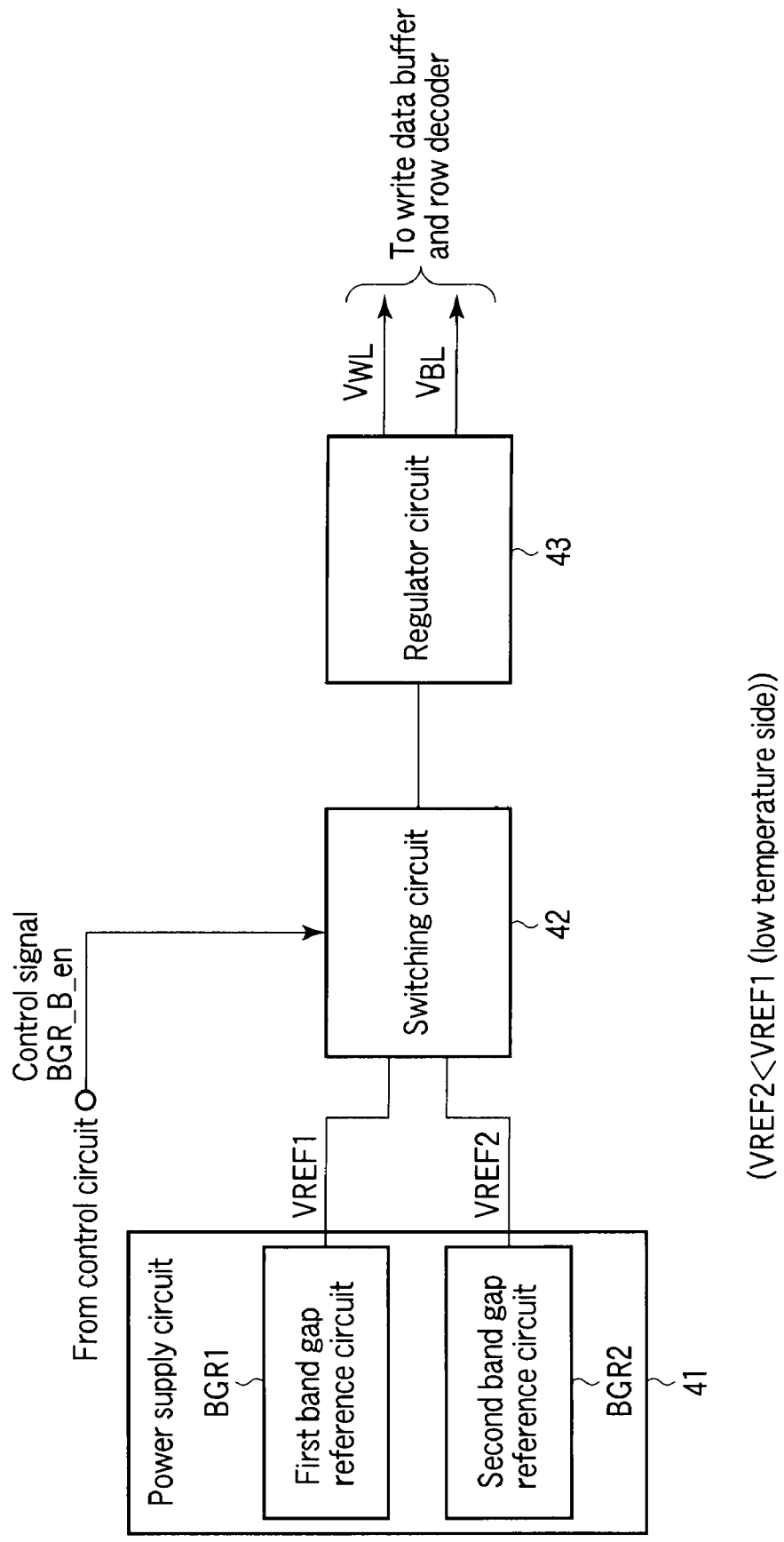
FIG. 1 is a block diagram for describing a semiconductor memory device according to the outline of the present invention.

The structure of this semiconductor memory device is, for example, as shown in FIG. 1.

Specifically, the semiconductor memory device comprises a memory cell array (not shown) which includes a plurality of memory cells arranged in a matrix at intersections between a plurality of word lines and a plurality of bit lines; and a power supply circuit 41. The power supply circuit 41 includes a first band gap reference circuit BGR1 which outputs a first output voltage VREF1, and a second band gap reference circuit BGR2 which outputs a second output voltage VREF2 (<VREF1) having lower temperature characteristics than the first output voltage on the low temperature side, and the power supply circuit 41 generates a power supply voltage on the basis of the second output voltage VREF2 at a time of a data write operation of a memory cell.

Figure 2:
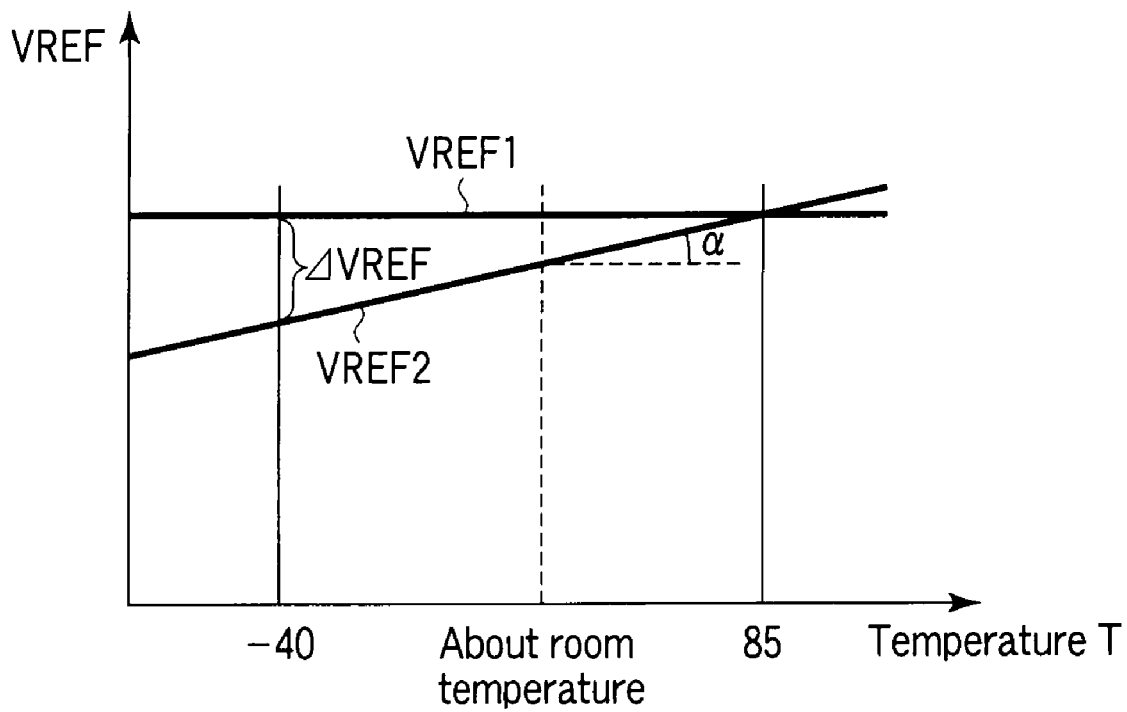
FIG. 2 is a graph showing output voltage versus temperature characteristics of first and second band gap reference circuits in FIG. 1.

FIG. 2 shows the temperature characteristics of the output voltages VREF1 and VREF2 of the first and second band gap reference circuits BGR1 and BGR2.

As shown in FIG. 2, the output voltage VREF1 of the first band gap reference circuit BGR1 is constant (const) in relation to temperatures. On the other hand, the second output voltage VREF2 of the second band gap reference circuit BGR2 has a positive gradient α, and has lower temperature characteristics than the first output voltage VREF1 on the low temperature side. For example, at about −40° C., the second output voltage VREF2 is lower than the first output voltage VREF1 by about ΔVREF. Similarly, at about a room temperature (about 20° C.), the second output voltage VREF2 is lower than the first output voltage VREF1. On the high temperature side (about 85° C.), the values of the output voltages VREF1 and VREF2 cross each other. Accordingly, on the high temperature side, the second output voltage VREF2 becomes higher than the first output voltage VREF1.

According to the above-described structure, at the time of the data write operation, with the power supply voltage that is based on the second output voltage VREF2 (<VREF1) which is lower than the first output voltage VREF1, data write can be executed with such a voltage relationship that the gate voltage and drain voltage, which are applied to selected memory cells, are lowered. Thus, even in the case where on the low temperature side, the variation of the threshold value of the memory cell increases and the cell write speed becomes higher, data write can be executed with a low voltage in accordance with the characteristics of the cell in which the write speed increases, and over-program can be prevented. In other words, when data write is executed, the write voltage of the memory cell is made lower at the time of low temperatures than at the time of high temperatures. Thereby, the difference in write speed due to the threshold variation is canceled and made uniform.

On the other hand, at a time of verify read operation, the output voltage is switched from the second output voltage VREF2 to the first output voltage VREF1 which is constant in relation to temperatures.

Therefore, without regard to the temperature at data read operation, read margin can be retained and the deterioration of the read time can be prevented.

As has been described above, according to the above-described structure, over-program can be prevented and the write time can be decreased.

Embodiments of the present invention, which are considered to be the best modes of the invention, will now be described with reference to the accompanying drawings. In the description below, NOR flash memories are taken as examples, but the invention is not limited to the NOR flash memories. In the description, common parts are denoted by like reference numerals throughout the drawings.

First Embodiment

NOR Flash Memory

1. Structure Example 1-1. Example of Entire Structure

To begin with, an example of the entire structure of a semiconductor memory device according to a first embodiment of the invention is described with reference to FIG. 3.

Figure 3:
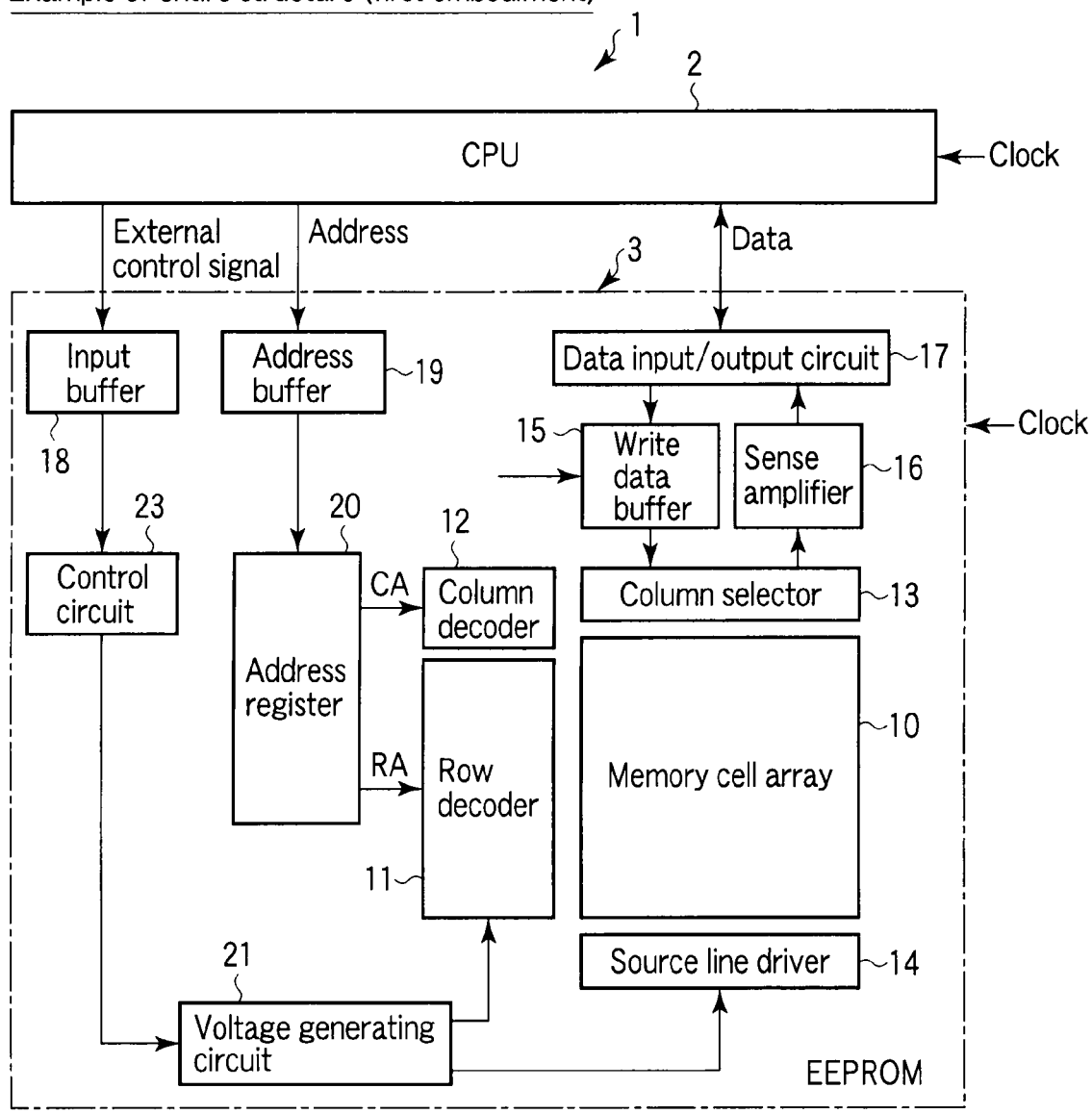
FIG. 3 is a block diagram showing an example of the entire structure of a semiconductor memory device according to a first embodiment of the present invention.

As shown in FIG. 3, a system LSI 1 includes a CPU 2 and a semiconductor memory device (EEPROM) 3. The CPU 2 and EEPROM 3 are connected via a data bus (not shown) so that data transmission/reception is executable therebetween.

The EEPROM 3 is a NOR flash memory in the case of the present example, and stores programs, data, etc. which are necessary for the operation of the CPU 2. The CPU 2 performs various arithmetic processes by using the data, etc., which are stored in the EEPROM 3. A clock CLK is input to the CPU 2 and EEPROM 3 from the outside. The CPU 2 operates in sync with the clock CLK, and the EEPROM 3 outputs data in sync with the clock CLK.

Next, the structure of the EEPROM 3 is described in detail. As shown in FIG. 1, the EEPROM 3 includes a memory cell array 10, a row decoder 11, a column decoder 12, a column selector 13, a source line driver 14, a write data buffer 15, a sense amplifier 16, a data input/output circuit 17, an input buffer 18, an address buffer 19, an address register 20, a voltage generating circuit 21, and a control circuit 23.

The memory cell array 10 includes a plurality of NOR flash memory cells which are arrayed in a matrix at intersections between a plurality of word lines and a plurality of bit lines. Each of the memory cells is connected to the associated bit line, word line and source line.

The row decoder 11 executes selection in a row direction of the memory cell array 10. Specifically, the row decoder 11 selects a word line. The column decoder 12 executes selection in a column direction of the memory cell array 10. The column selector 13 selects a bit line on the basis of the selection operation of the column decoder 12, and connects the bit line to the write data buffer 15 or sense amplifier 16. The source line driver 14 applies a voltage to the source line. The sense amplifier 16 senses and amplifies data which is read out of the memory cell that is selected by the row decoder 11 and column decoder 12. The write data buffer 15 stores data that is to be written in the memory cells, and writes the data batchwise in the memory cells in units of a predetermined number of memory cells.

The data input/output circuit 17 receives write data which is delivered from the CPU 2, and transfers the data to the write data buffer 15. In addition, the data input/output circuit 17 successively outputs data, which is amplified by the sense amplifier 16, to the CPU 2 in sync with the clock.

The input buffer 18 receives an external control signal which is delivered from the CPU 2, and outputs the external control signal to the control circuit 23. The external control signal is, for instance, a chip enable signal, a write enable signal, or an output enable signal. The chip enable signal is a signal which sets the EEPROM 3 in an operable state. The write enable signal is a signal which sets the EEPROM 3 in a data writable state. The output enable signal is a signal which sets the EEPROM 3 in an data outputtable state. The address buffer 19 receives addresses which are delivered from the CPU 2, and outputs the addresses to the address register 20.

In accordance with the addresses which are delivered from the address buffer 19, the address register 20 outputs a column address CA to the column decoder 12 and outputs a row address RA to the row decoder 11. On the basis of the column address CA and row address RA, the column decoder 12 and row decoder 11 execute operations of selecting the bit line and word line.

The voltage generating circuit 21 comprises a power supply circuit which includes band gap reference circuits, and generates, e.g. predetermined write/erase/read voltages in accordance with an external voltage. The voltage, which is generated by the voltage generating circuit 21, is delivered to, for example, the row decoder 11, memory cell array 10, source line driver 14, write data buffer 15 and sense amplifier 16.

The control circuit 23 controls the operations of the above-described circuit.

1-2. Structure Example of Memory Cell Array

Figure 4:
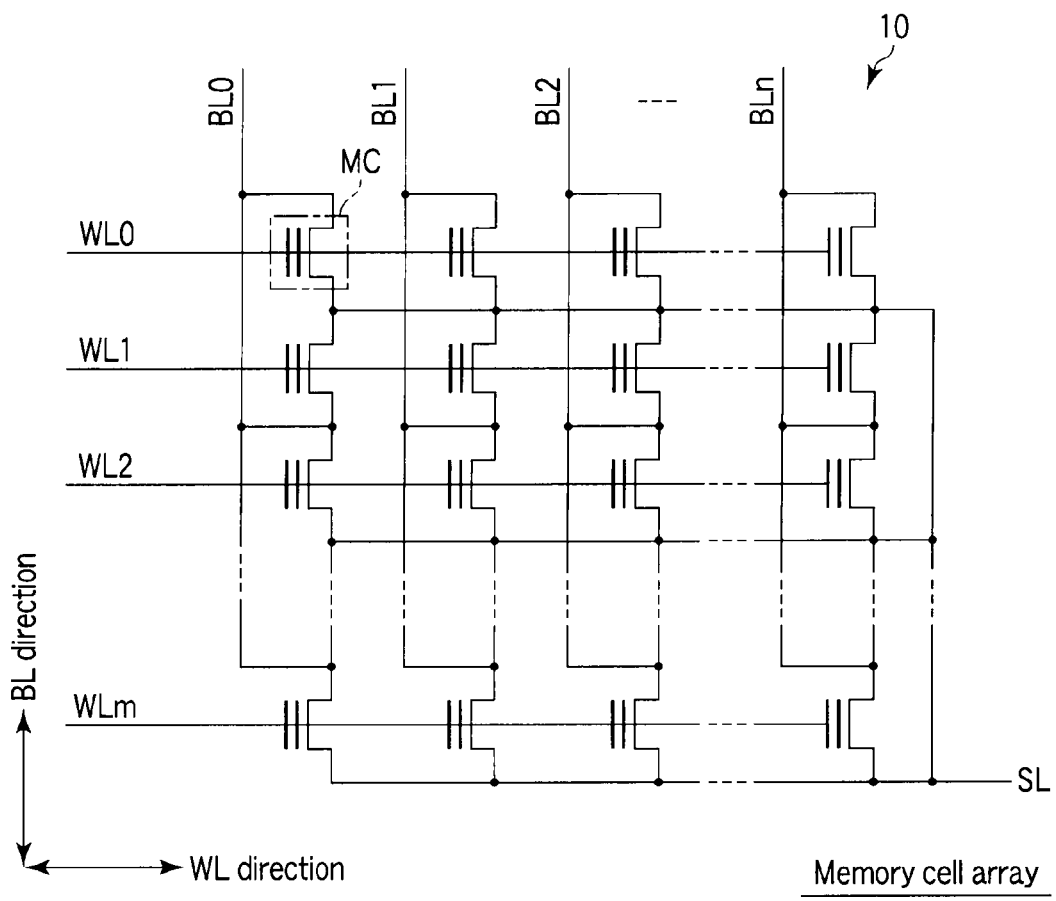
FIG. 4 is an equivalent circuit diagram showing a memory cell array which is included in the semiconductor memory device according to the first embodiment.
Figure 5:
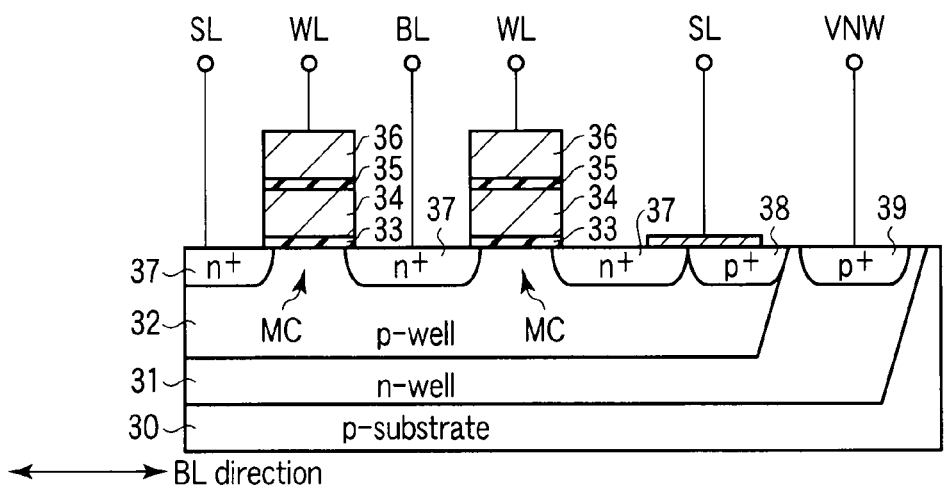
FIG. 5 is a cross-sectional view of the memory cell array which is included in the semiconductor memory device according to the first embodiment.

Next, referring to FIG. 4 and FIG. 5, a structure example of the memory cell array 10 according to the present embodiment is described.

FIG. 4 is an equivalent circuit diagram showing the structure of the memory cell array 10. As shown in FIG. 4, the memory cell array 10 includes an ((m+1)×(n+1)) (m, n: a natural number) number of memory cells MC. The memory cell MC is a MOS transistor having a multi-layer gate including a charge accumulation layer (e.g. a floating gate) and a control gate. The control gates of the memory cells MC in the same row are commonly connected to the same word line, which is any one of word lines WL0 to WLm. The drains of the memory cells MC in the same column are commonly connected to the same bit line, which is any one of bit lines BL0 to BLn. In addition, the sources of the memory cells MC in the same column are commonly connected to the same source line SL.

Next, the cross-sectional structure of the memory cell MC is described with reference to FIG. 5. FIG. 5 is a cross-sectional view of a part of the memory cell array 10 in the bit line direction. As shown in FIG. 5, an n-type well region 31 is formed in a surface region of a p-type semiconductor substrate 30. A p-type well region 32 is formed in a surface region of the n-type well region 31. A gate insulation film 33 is formed on the p-type well region 32, and a gate electrode of the memory cell MC is formed on the gate insulation film 33. The gate electrode of the memory cell MC includes a polycrystalline silicon layer 34 which is formed on the gate insulation film 33, and a polycrystalline layer 36 which is formed on the polycrystalline silicon layer 34 via an inter-gate insulation film 35. The inter-gate insulation film 35 is formed of, e.g. a silicon oxide film, or an ON film, an NO film or an ONO film, which is a multi-layer structure of a silicon oxide film and a silicon nitride film. The polycrystalline silicon layer 34 functions as a floating gate (FG) and is isolated in association with each of the memory cells MC. On the other hand, the polycrystalline silicon layers 36, which neighbor in a direction perpendicular to the bit lines, are commonly connected and function as a control gate (word line WL). An $n^+$ impurity diffusion layer 37 is formed in a surface portion of the p-type well region 32, which is located between the neighboring gate electrodes. The impurity diffusion layer 37 is shared by the neighboring transistors, and functions as a source region or a drain region. The source region of the memory cell MC is connected to the source line SL, and the drain of the memory cell MC is connected to the bit line BL. Further, a $p^+$ impurity diffusion layer 38 is formed in a surface region of the p-type well region 32, and an $n^+$ impurity diffusion layer 39 is formed in a surface region of the n-type well region 31. The same potential as in the source line SL is applied to the p-type well region 32 via the impurity diffusion layer 38, and a well voltage VNW is applied to the n-type well region 31 via the impurity diffusion layer 39.

1-3. Structure Example of Voltage Generating Circuit

Figure 7:
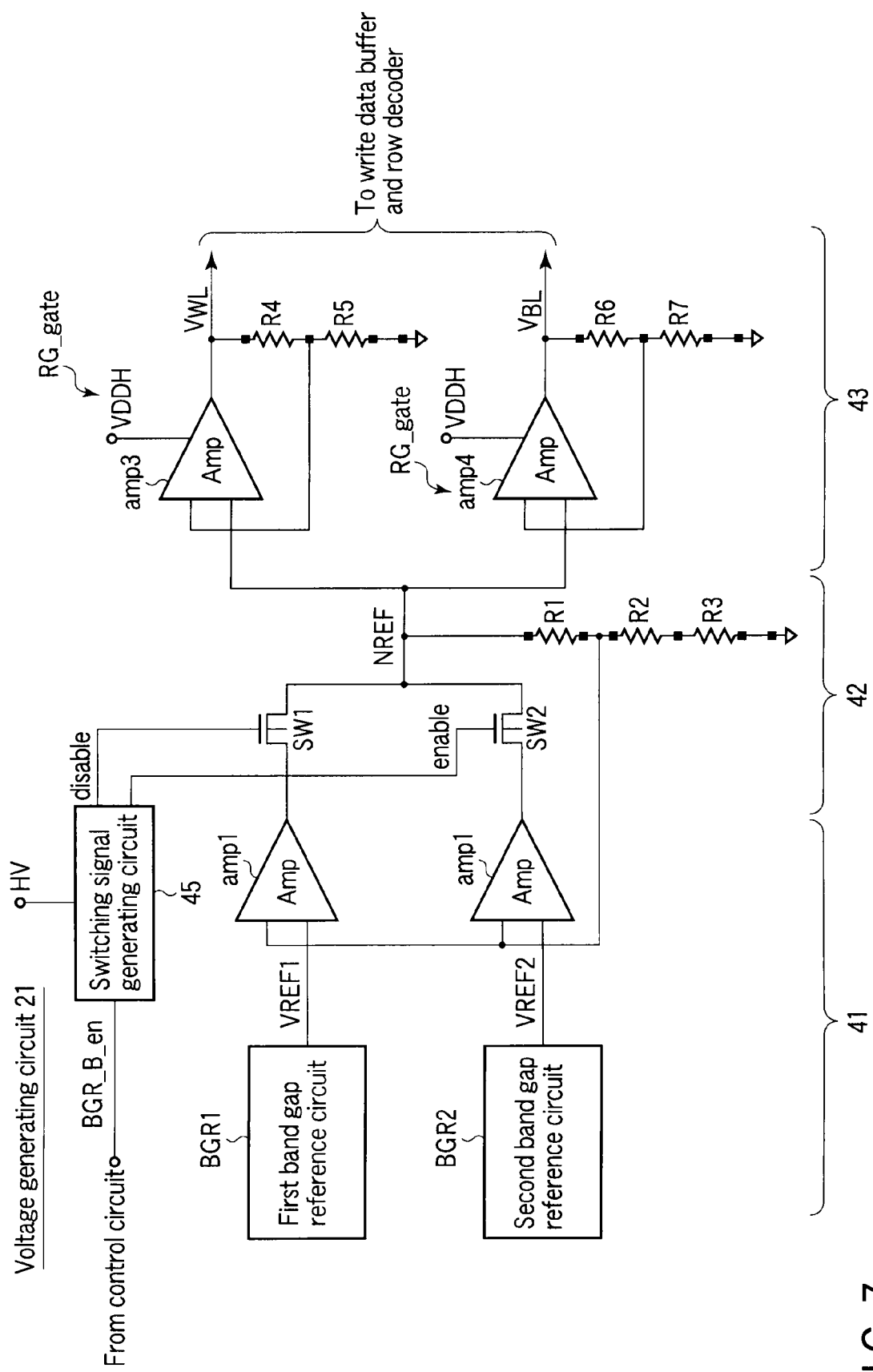
FIG. 7 is an equivalent circuit diagram showing the voltage generating circuit which is included in the semiconductor memory device according to the first embodiment.

Next, referring to FIG. 6 and FIG. 7, a description is given of the structure of the voltage generating circuit 21 according to the present embodiment.

As shown in FIG. 6, the voltage generating circuit 21 comprises a power supply circuit 41, a switching circuit 42 and a regulator circuit 43.

The power supply circuit 41 includes first and second band gap reference circuits BGR1 and BGR2, and generates first and second output voltages VREF1 and VREF2 as power supply voltages.

The switching circuit 42 has an input connected to an output (output voltage VREF1, VREF2) of the power supply circuit 41. In accordance with a control signal (BGR_B_en) from the control circuit 23, the switching circuit 42 selectively outputs one of the output voltages VREF1 and VREF2 by effecting switching between the output voltages VREF1 and VREF2. For example, at the time of the data write operation, the switching circuit 42 effects switching from the first output voltage VREF1 to the second output voltage VREF2, which has lower temperature characteristics on the low temperature side than the first output voltage VREF1, in accordance with the control signal (BGR_B_en), and outputs the second output voltage VREF2. On the other hand, for example, at the time of the verify read operation, the switching circuit 42 effects switching from the second output voltage VREF2 to the first output voltage VREF1, which is higher than the second output voltage VREF2 on the low temperature side and is constant (with no temperature characteristics), in accordance with the control signal (BGR_B_en), and outputs the first output voltage VREF1.

The regulator circuit 43 has an input connected to an output of the switching circuit 42, and outputs a word line voltage VWL and a bit line voltage VBL, which are produced by subjecting the input voltage to predetermined standardization, to the write data buffer 15 and row decoder 11.

Concrete Structure Example of Voltage Generating Circuit

FIG. 7 shows a concrete structure example of the voltage generating circuit 21.

As shown in FIG. 7, the power supply circuit 41 comprises first and second band gap reference circuits BGR1 and BGR2, and amplifiers amp1 and amp2.

A first input terminal of the amplifier amp1 is connected to one end of a resistor element R1, and a second input terminal of the amplifier amp1 is connected to the output (VREF1) of the first band gap reference circuit BGR1. The amplifier amp1 outputs an amplified voltage to the switching circuit 42. A first input terminal of the amplifier amp2 is connected to the above-mentioned one end of the resistor element R1, and a second input terminal of the amplifier amp2 is connected to the output (VREF2) of the second band gap reference circuit BGR2. The amplifier amp2 outputs an amplified voltage to the switching circuit 42.

The switching circuit 42 comprises a switching signal generating circuit 45, switching elements SW1 and SW2 and resistor elements R1 to R3.

The switching signal generating circuit 45 is supplied with an internal power supply voltage HV, and the switching signal generating circuit 45 outputs a switching signal (enable, disable) in accordance with the control signal (BGR_B_en) from the control circuit. The internal power supply voltage HV is a voltage which is sufficiently higher than the sum of the output voltage (VREF1, VREF2) of each of the first and second band gap reference circuits BGR1, BGR2 and the threshold voltage (VthNch) of the switching element SW1, SW2.

The gate of the switching element SW1 is connected to the switching signal (disable). One end of the current path of the switching element SW1 is connected to the output of the amplifier amp1, and the other end of the current path of the switching element SW1 is connected to an input node (NREF) of the regulator circuit 43. The gate of the switching element SW2 is connected to the switching signal (enable). One end of the current path of the switching element SW2 is connected to the output of the amplifier amp2, and the other end of the current path of the switching element SW2 is connected to the input node (NREF) of the regulator circuit 43.

The other end of the resistor element R1 is connected to the node NREF. The resistor element R2 and the resistor element R3 are connected, at one end and the other end thereof, in series between the resistor element R1 and the ground power supply (GND).

The regulator circuit 43 comprises a gate regulator circuit RG_gate and a drain regulator circuit RG_drain.

The gate regulator circuit RG_gate is composed of an amplifier amp3 and resistor elements R4 and R5. The amplifier amp3 is supplied with an internal power supply voltage VDDH. A first input of the amplifier amp3 is connected to the output (node NREF) of the switching circuit 42, and a second input of the amplifier amp3 is connected to one end of the resistor element R4. The amplifier amp3 outputs a predetermined word line voltage VWL (the gate voltage of the memory cell). The internal power supply voltage VDDH is higher than the output voltage VWL and is, e.g. about 10 V. The other end of the resistor element R4 is connected to the output of the amplifier amp3. One end of the resistor element R5 is connected to the above-mentioned one end of the resistor element R4, and the other end of the resistor element R5 is connected to a ground power supply.

The drain regulator circuit RG_drain is composed of an amplifier amp4 and resistor elements R6 and R7. The amplifier amp4 is supplied with the internal power supply voltage VDDH. A first input of the amplifier amp4 is connected to the output (node NREF) of the switching circuit 42, and a second input of the amplifier amp4 is connected to one end of the resistor element R6. The amplifier amp4 outputs a predetermined bit line voltage VBL (the drain voltage of the memory cell). The internal power supply voltage VDDH is higher than the output voltage VBL and is, e.g. about 10 V. The other end of the resistor element R6 is connected to the output of the amplifier amp4. One end of the resistor element R7 is connected to the above-mentioned one end of the resistor element R6, and the other end of the resistor element R7 is connected to the ground power supply.

Next, equivalent circuit structures of the respective structural components are described in greater detail.

1-3-1. Structure Example of the First Band Gap Reference Circuit

The circuit structure of the first band gap reference circuit BGR1 is described with reference to FIG. 8 and FIG. 9.

As shown in FIG. 8, the first band gap reference circuit BGR1 comprises an amplifier (operational amplifier) amp5, resistor elements R1a to R3a, a p-channel MOS transistor P1a, a diode 51a, and an N-number of diodes 52a. The number of diodes 52a is, e.g. 100 in the case of this example (N=100).

The MOS transistor P1a has a gate connected to an output terminal of the amplifier amp5, and has a source supplied with an internal power supply voltage VDD.

The resistor element R1a has one end connected to the drain of the MOS transistor P1a, and the other end connected to the anode of the diode 51a. The cathode of the diode 51a is grounded. The resistor element R2a has one end connected to the drain of the MOS transistor P1a, and the other end connected to the one end of the resistor element R3a. The other end of the resistor element R3a is connected to the anodes of the N-number of diodes 52a. The cathodes of the diodes 52a are grounded.

A connection node between the other end of the resistor element R1a and the anode of the diode 51a is connected to an inversion input terminal Va(−) of the amplifier amp5. A connection node between the other end of the resistor element R2a and the above-mentioned one end of the resistor element R3a is connected to a positive input terminal Vb(+) of the operational amplifier amp5. A voltage at the connection node between the drain of the MOS transistor P1a, one end of the resistor element R1a and one end of the resistor element R2a is output as the output voltage VREF1 of the band gap reference circuit BGR1.

If the resistance values of the resistor elements R1a to R3a are R1a to R3a and the voltage drop at the diode 51a is Vf1, the output voltage VREF1 of the band gap reference circuit BGR1 is expressed by $$VREF1 = Vf1 + kT/q \cdot (R2a/R3a) \cdot \ln(N) \qquad \text{equation (1)}$$

where k is the Boltzmann constant, T is the absolute temperature, and q is an electron charge amount. The temperature characteristics of the voltage kT/q are expressed by the following equation (2) which is obtained by differentiating the equation (1) by the temperature:

$$dVREF1/dT = dVf1/dT + (k/q) \cdot (R2a/R3a) \ln(N) \qquad \text{equation (2)}$$

In equation (2), the first term is a variable which is determined by the characteristics of the semiconductor device included in the band gap reference circuit BGR1, and the second term is a variable which is determined by the resistance ratio of the resistor elements R1a to R3a. In the band gap reference circuit BGR1, the resistance ratio of the second term is so set that the temperature variation of the voltage VREF1 in the first term is canceled by the second term.

Accordingly, as shown in FIG. 9, the output voltage VREF1 has a constant value regardless of temperatures. FIG. 9 is a graph showing the temperature characteristics of the band gap reference circuit BGR1. In FIG. 9, the abscissa indicates the temperature T, and the ordinate indicates the output voltage VREF. As shown in FIG. 9, the output voltage VREF1 is constant (const) relative to the temperature T.

1-3-2. Structure Example of the Second Band Gap Reference Circuit

Next, the circuit structure of the second band gap reference circuit BGR2 is described with reference to FIG. 10 and FIG. 11.

Figure 10:
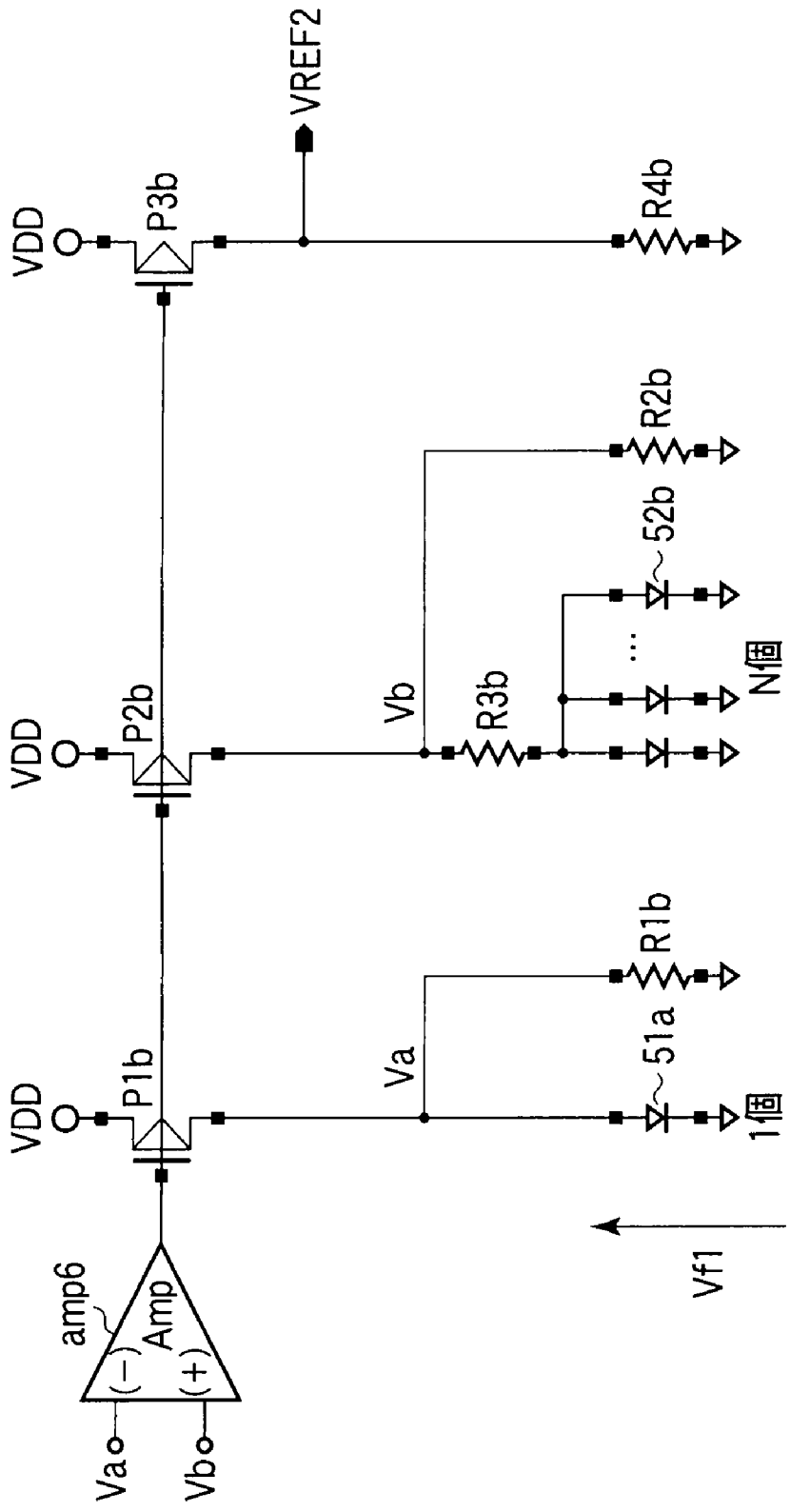
FIG. 10 is an equivalent circuit diagram showing a second band gap reference circuit in FIG. 7.

As shown in FIG. 10, the second band gap reference circuit BGR2 comprises an amplifier amp6, resistor elements R1b to R4b, p-channel MOS transistors P1b to P3b, a diode 51b, and an N-number of diodes 52b. The number of diodes 52b is, e.g. 100 in the case of this example (N=100).

The MOS transistors P1b to P3b have their gates commonly connected to the output terminal of the amplifier amp5. An internal power supply voltage VDD is commonly applied to the sources of the MOS transistors P1b to P3b.

The resistor element R1b has one end connected to the drain of the MOS transistor P1b, and has the other end grounded. The anode of the diode 51b is connected to the drain of the MOS transistor P1b, and the cathode of the diode 51b is grounded. A connection node between the above-mentioned one end of the resistor element R1b and the anode of the diode 51b is connected to an inversion input terminal Va(−) of the amplifier amp6.

The resistor element R2b has one end connected to the drain of the MOS transistor P2b, and has the other end grounded. The resistor element R3b has one end connected to the drain of the MOS transistor P2b, and has the other end connected to the anodes of the diodes 52b. The cathode of each diode 52b is grounded. A connection node between the above-mentioned one end of the resistor element R2b and the above-mentioned one end of the resistor element R3b is connected to a positive input terminal Va(+) of the operational amplifier amp6.

The resistor element R4b has one end connected to the drain of the MOS transistor P3b, and has the other end grounded.

The output voltage VREF2 of the second band gap reference circuit BGR2 is output from the connection node between the drain of the MOS transistor P3b and the resistor element R4a.

If the resistance values of the resistor elements R1b to R4b are R1b to R4b and the voltage drop at the diode 51b is Vf1, the output voltage VREF2 of the second band gap reference circuit BGR2 is expressed by $$VREF2=(R4b/R2b)\cdot Vf1+kT/q\cdot (R2b/R3b)\cdot 1n(N) \quad \text{equation (3)}$$

where the resistance values R1b and R2b are equal. The temperature characteristics of the voltage kT/q are expressed by the following equation (4) which is obtained by differentiating the equation (3) by temperatures:

$$dVREF2/dT=d(R4b/R2b)\cdot Vf1/dt+(k/q)\cdot (R2b/R3b)1n(N) \quad \text{equation (4)}$$

In equation (4), the first term is a variable which is determined by the characteristics of the semiconductor device included in the band gap reference circuit BGR2, and the second term is a variable which is determined by the resistance ratio of the resistor elements R2b and R3b. Thus, in the second band gap reference circuit BGR2, predetermined temperature characteristics can be obtained by varying the resistance ratio between the resistor elements R2b and R3b in the second term. Furthermore, the reference voltage that is output can be adjusted by varying the magnitude of the resistance value RL.

If the circuit structure as in the present example, which is usable in the switching from the data write operation to the verify read operation, is to be realized by a single band gap reference circuit BGR, the power supply voltage itself is made different. Consequently, the setting of the resistance division (R4 to R7) of the gate voltage/drain voltage regulator circuits RG_gate RG_drain has to be altered, and the control becomes complex.

However, according to the structure of the second band gap reference circuit BGR2 of the present example, as shown in FIG. 10, the resistance value of the resistor RL is adjusted by setting the resistance ratio between the resistor elements R2b and R3b. Thereby, the condition for such desirable temperature characteristics as to become lower than the output voltage VREF1 on the low temperature side can be set.

Figure 11:
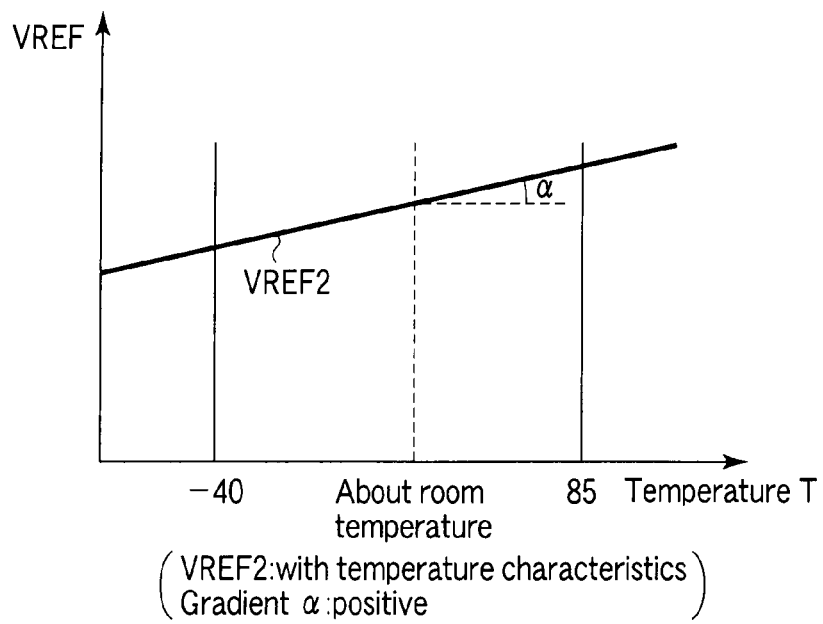
FIG. 11 shows temperature characteristics of the second band gap reference circuit in FIG. 10.

Thus, the temperature characteristics of the output voltage VREF2 according to the present example are as shown in FIG. 11. The output voltage VREF2, as shown in FIG. 11, has a positive gradient α, and has low temperature characteristics on the low temperature side. The temperature characteristics of this output voltage VREF2 can be set, for example, on the basis of the temperature characteristics of the write speed of the memory cell, which is tested at the time of, e.g. a function test.

Figure 12:
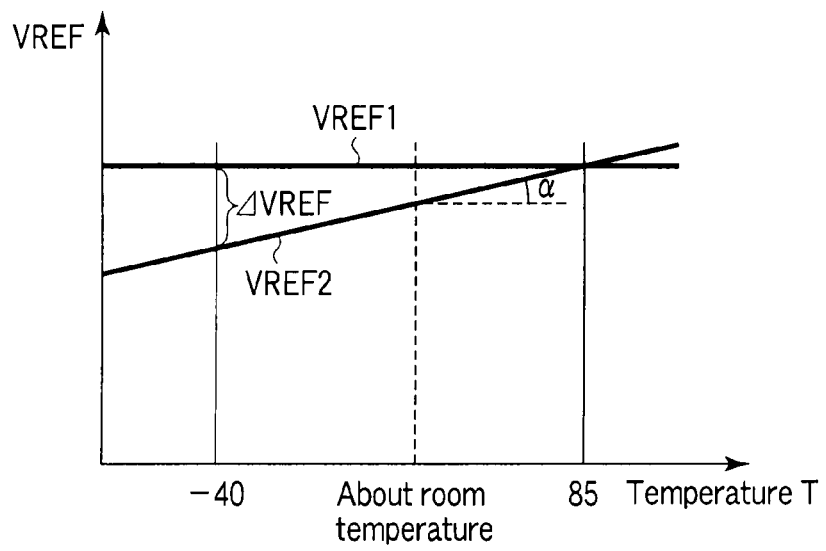
FIG. 12 is a graph showing temperature characteristic of the first and second band gap reference circuits according to the first embodiment.

As has been described in the above sections 1-3-1 and 1-3-2, the temperature characteristics of the output voltages VREF1 and VREF2 according to the present example are as shown in FIG. 12. As shown in FIG. 12, the output voltage VREF1 of the first band gap reference circuit BGR1 is constant (const) relative to temperatures. On the other hand, the output voltage VREF2 of the second band gap reference circuit BGR2 has the positive gradient α and has lower temperature characteristics than the first output voltage VREF1 on the low temperature side. For example, at about −40° C., the second output voltage VREF2 is lower than the first output voltage VREF1 by about ΔVREF. Similarly, at about a room temperature (about 20° C.), the second output voltage VREF2 is lower than the first output voltage VREF1. On the high temperature side (about 85° C.), the values of the output voltages VREF1 and VREF2 cross each other. Accordingly, on the high temperature side, the second output voltage VREF2 becomes higher than the first output voltage VREF1.

1-3-3. Structure Example of the Switching Signal Generating Circuit

Next, referring to FIG. 13, a structure example of the switching signal generating circuit 45 according to the present embodiment is described.

As shown in FIG. 13, the switching signal generating circuit 45 comprises first and second switching signal generating units 53-1 and 53-2.

The first switching signal generating units 53-1 includes an even-number (n-number: n=2, 4, . . . ) of inverters inv1, a NOR gate 55, a level shifter 56 and an inverter inv2.

The even-number (n-number) of inverters inv1 have their input and output connected in series between the control signal BGR_B_en and a first input of the NOR gate 55. A second input of the NOR gate 55 is connected to the control signal BGR_B_en. An internal power supply voltage HV is input to the voltage level shifter (L/S: Voltage Level Shifter) 56. The input of the level shifter 56 is connected to the output of the NOR gate 55. The inverter inv2 is supplied with the internal power supply voltage HV. The input of the inverter inv2 is connected to the output of the voltage level shifter 56. The inverter inv2 outputs a switching signal (enable), which is obtained by inverting the input, to the gate of the switching element SW2.

The second switching signal generating units 53-2 includes an odd-number (m-number: n=1, 3, . . . ) of inverters inv4, a NOR gate 57, a level shifter 58 and inverters inv3 and inv5.

The odd-number (m-number) of inverters inv4 have their input and output connected in series between the control signal BGR_B_en and a first input of the NOR gate 57. An input of the inverter inv3 is supplied with the control signal BGR_B_en, and an output of the inverter inv3 is connected to a second input of the NOR gate 57. The internal power supply voltage HV is input to the voltage level shifter 58. The input of the level shifter 58 is connected to the output of the NOR gate 57. The inverter inv5 is supplied with the internal power supply voltage HV. The input of the inverter inv5 is connected to the output of the voltage level shifter 58. The inverter inv5 outputs a switching signal (disable), which is obtained by inverting the input, to the gate of the switching element SW1.

2. Write Operation

Next, the write operation of the semiconductor memory device according to the present embodiment is described. The description is given with reference to a timing chart of FIG. 14.

2-1. Example of Data Write Operation

To begin with, the data write operation is described with reference to FIG. 14, FIG. 15A and FIG. 15B. At the time of the data write operation, data write is executed in the memory cell by the power supply voltage that is based on the second output voltage VREF2 (<VREF1) which is lower than the first output voltage VREF1 on the low temperature side.

At time point t1 in FIG. 14, if the voltage level of the control signal BGR_B_en, which is input from the control circuit 23 to the switching circuit 42, rises from an "L" level to an "H" level, the voltage level of the switching signal "disable" falls from an "H" level to an "L" level. Accordingly, the current path of the switching element SW1 is switched off, and the output voltage VREF1 from the first band gap reference circuit BGR1 is cut off.

Subsequently, at time point t2 after a time ΔT1, when the voltage level of the control signal BGR_B_en is the "H" level, the voltage level of the switching signal "enable" rises from an "L" level to an "H" level. Accordingly, the current path of the switching element SW2 is switched on, and the output voltage VREF2 from the second band gap reference circuit BGR2 is output.

In this case, at the switching timing of the switching elements SW1 and SW2, the switching circuit 42 provides the predetermined time ΔT1 in which both the switching signals "enable" and "disable" are set in the "L" level. Since the outputs of the two amplifiers amp1 and amp2 in the power supply circuit 41 are turned off at the same time, fluctuations of the outputs of the amplifiers amp1 and amp2 and the node NREF can be prevented.

Then, the regulator circuit 43 receives the output voltage VREF2 from the second band gap reference circuit BGR2 and generates the word line voltage VWL and bit line voltage VBL.

Following the above, the control circuit 23 controls the row decoder 11, column decoder 12 and write data buffer 15, and executes data write by the word line voltage VWL and bit line voltage VBL, which are generated from the output voltage VREF2.

Specifically, electrons are injected in the charge accumulation layer (e.g. floating gate) of the selected memory cell MC ("0" write), thereby raising the threshold value of the selected memory cell MC and executing data write.

Re: Two-Value Mode and Multi-Value Mode in Data Write

As regards the data write mode, a description is given of, for example, a two-value mode (two-value write) and a multi-value mode (multi-value write). In this example, a four-value mode is described as the multi-value mode.

To begin with, the four-value mode is described. The memory cell MC in this case can store four data, "11", "01", "10" and "00", in the order from the lowest threshold voltage Vth. The threshold voltage Vth of the memory cell, at which "11" data is stored, is Vth<0 V. The threshold voltage Vth of the memory cell, at which "01" data is stored, is 0 V<Vth<Vth1. The threshold voltage Vth of the memory cell, at which "10" data is stored, is Vth1<Vth<Vth2. The threshold voltage Vth of the memory cell, at which "00" data is stored, is Vth2<Vth<Vth3.

Next, the two-value mode is described. The memory cell MC in this case can store two data, "1", "0", in the order from the lowest threshold voltage Vth. The threshold voltage Vth of the memory cell, at which "1" data is stored, is Vth<0 V. The threshold voltage Vth of the memory cell, at which "0" data is stored, is Vth1<Vth<Vth2. Specifically, the threshold voltage for "1" data is equal to the threshold voltage for "11" data in the four-value mode, and the threshold voltage for "0" data is equal to the threshold voltage for "10" data in the four-value mode.

In other words, the two-value mode is an operation mode in which only lower bits in the two-bit data in the four-value mode are used. The control circuit 23 or the external CPU 2 executes control as to whether data write is to be performed in the memory cell in the two-value mode or in the four-value mode.

Data write is first executed from the lower bit. If the erase state is "11" ("--", "-" means "indefinite"), the lower bit is first written. The memory cell transistor MT stores "11" ("-1") or "10" ("-0"). In the case of the two-value mode, data write is thus completed.

In the case of data write in the four-value mode, the upper bit is subsequently written. As a result, the memory cell transistor MT, which stores "11" ("-1"), stores "11" or "01", stores "11" or "01", and the memory cell transistor MT, which stores "10" ("-0"), stores "10" or "00". The same applies to other multi-value modes, such as an 8-value mode and a 16-value mode.

At the time of the data write operation of the present example, regardless of the two-value mode or the multi-value mode, as shown in FIG. 12, data write can be executed in the memory cell by the power supply voltage which is based on the second output voltage VREF2 (<VREF1) that has lower temperature characteristics than the first output voltage VREF1 on the low temperature side (about a room temperature). Thus, even in the case where on the low temperature side, the variation of the threshold value of the memory cell increases and the cell write speed becomes higher, data write can be executed in accordance with the characteristics of the cell in which the write speed increases, and over-program can be prevented.

2-2. Example of Verify Read Operation

Figures 15A, 15B:
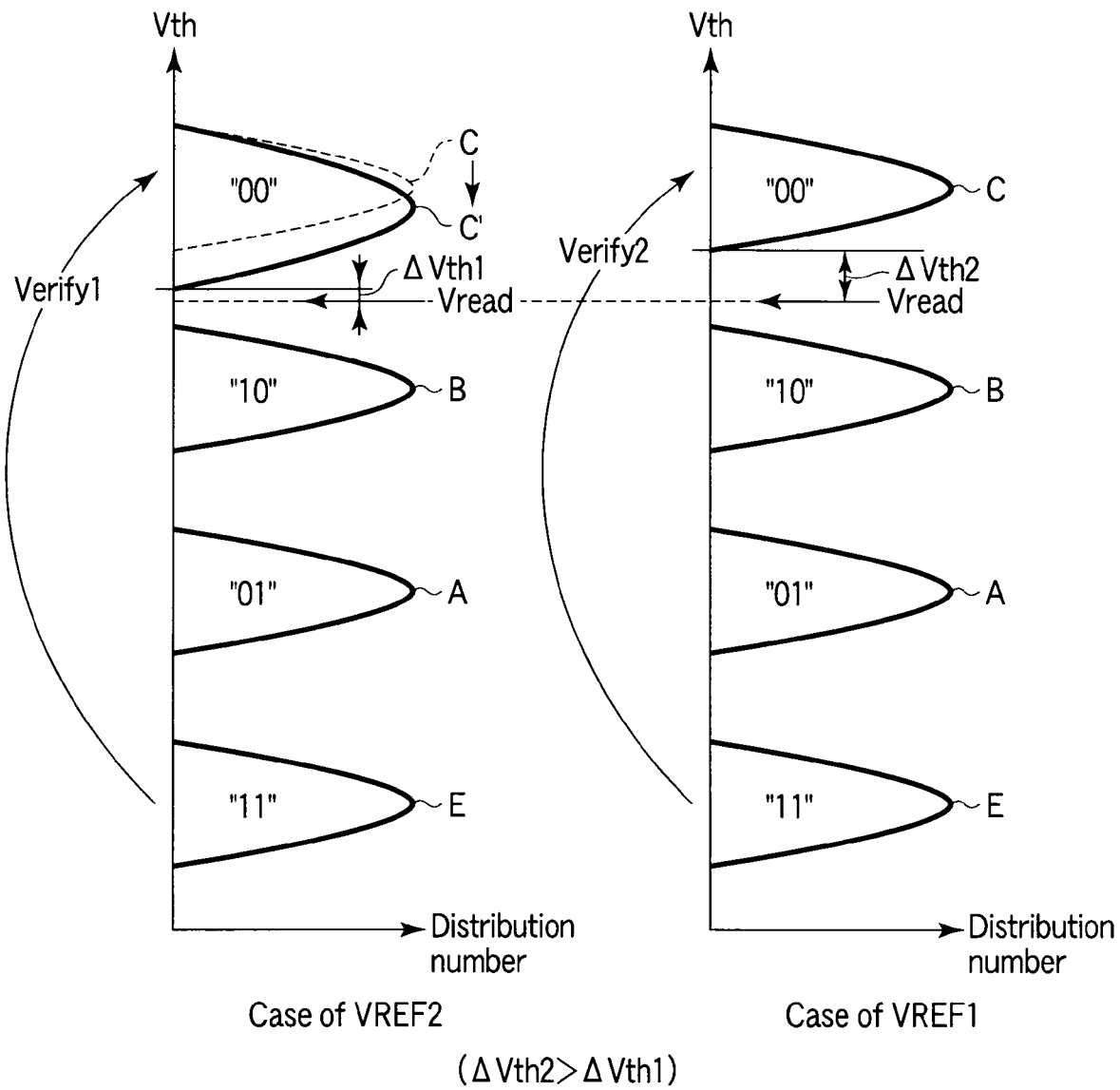
FIG. 15A is a threshold distribution diagram for explaining verify read of the semiconductor device according to the first embodiment.
FIG. 15B is a threshold distribution diagram for explaining verify read of the semiconductor device according to the first embodiment.
Figure 16:
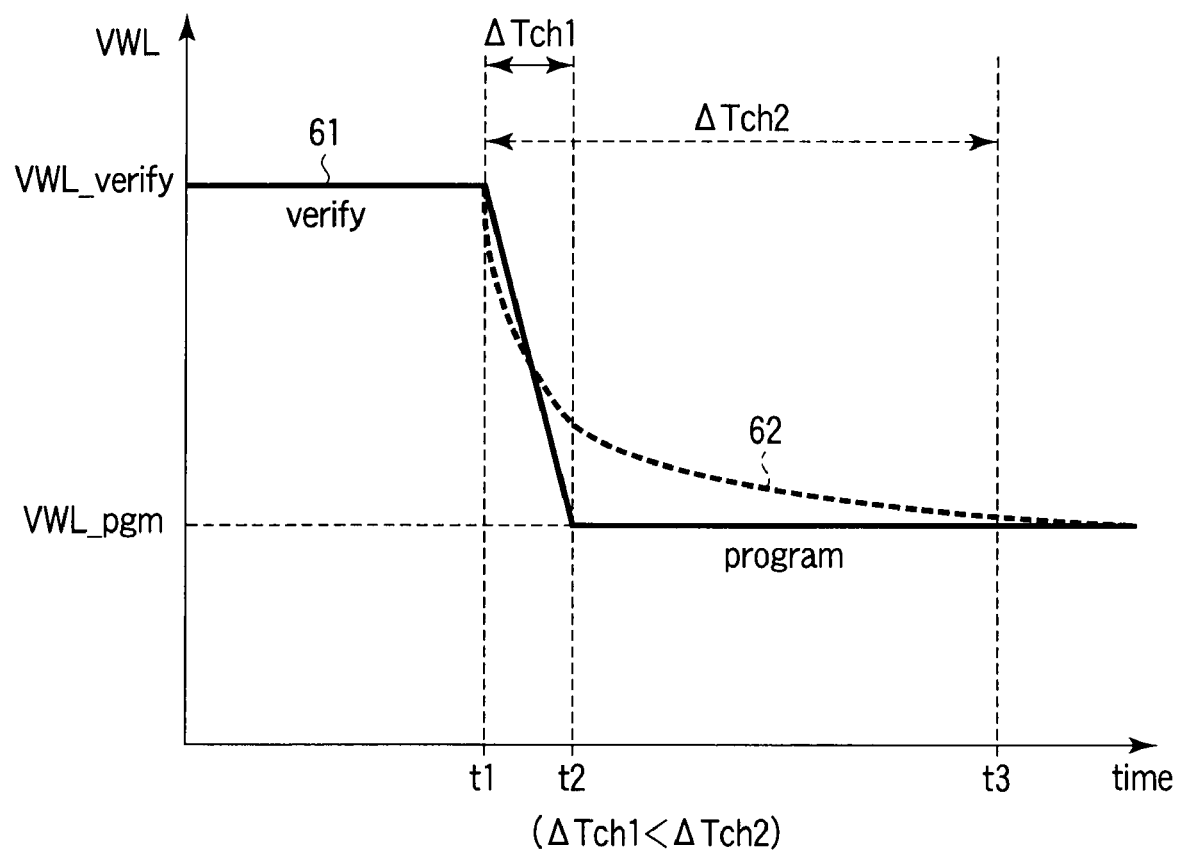
FIG. 16 is a timing chart for explaining the transition time of the semiconductor device according to the first embodiment.

Next, referring to FIG. 14 to FIG. 16, the verify read operation is described. At the time of the verify read operation, data read is executed in the memory cell by the power supply voltage that is based on the first output voltage VREF1 (>VREF2) which is higher than the second output voltage VREF2 on the low temperature side and is constant (with no temperature characteristics).

At time point t3 in FIG. 14, if the voltage level of the control signal BGR_B_en, which is input from the control circuit 23 to the switching circuit 42, falls from the "H" level to the "L" level, the voltage level of the switching signal "enable" falls from the "H" level to the "L" level. Accordingly, the current path of the switching element SW2 is switched off, and the output voltage VREF2 from the second band gap reference circuit BGR2 is cut off.

Subsequently, at time point t4 after a time ΔT2, when the voltage level of the control signal BGR_B_en is the "L" level, the voltage level of the switching signal "disable" rises from the "L" level to the "H" level. Accordingly, the current path of the switching element SW1 is switched on, and the output voltage VREF1 from the first band gap reference circuit BGR1 is output.

In this case, like the data write operation, at the switching timing, the switching circuit 42 provides the predetermined time ΔT2 in which both the switching signals "enable" and "disable" are set in the "L" level. Since the outputs of the two amplifiers amp1 and amp2 in the power supply circuit 41 are turned off at the same time during the predetermined time ΔT2, fluctuations of the outputs of the amplifiers amp1 and amp2 and the node NREF can be prevented.

Then, the regulator circuit 43 receives the output voltage VREF1 from the first band gap reference circuit BGR1 and generates the word line voltage VWL and bit line voltage VBL.

Following the above, the control circuit 23 controls the row decoder 11 and column decoder 12, and executes the verify read operation by the word line voltage VWL and bit line voltage VBL, which are generated from the output voltage VREF1.

Specifically, the sense amplifier 16 executes data read from the selected memory cell, thereby to determine whether a threshold voltage of the selected memory cell reaches a predetermined verify voltage Vverify. If the threshold voltage does not reach the verify voltage Vverify, further data write operation is executed in the selected memory cell. Subsequently, until the threshold voltage reaches the verify voltage Vverify, the verify read operation and the data write operation are repeated for the selected memory cell. Thus, the selected memory cell is written to a target threshold voltage.

Threshold Distribution at the Time of Verify Read Operation

As has been described above, at the time of the verify read operation, the power supply voltage is switched from the second output voltage VREF2 to the first output voltage VREF1 (>VREF2) that is higher than the second output voltage VREF2 on the low temperature side. Therefore, at the data read operation, read margin can be retained and the deterioration of the read time can be prevented.

The reason for this is explained with reference to FIG. 15A and FIG. 15B. FIG. 15A and FIG. 15B are graphs showing threshold distributions of the memory cells in the four-value mode. FIG. 15A shows a threshold distribution in the case where verify read is executed by the second output voltage VREF2, and FIG. 15B shows a threshold distribution in the case where verify read is executed by the first output voltage VREF1. In this example, a description is given of the case in which data write is executed from the "11" state ("E": erase state) to the "00" state ("C": write state) in the four-value mode.

To begin with, as shown in FIG. 15A, a description is given of the case in which verify read is executed by the second output voltage VREF2. As shown in FIG. 15A, since the output voltage falls on the low temperature side, the verify voltage Vverify1 decreases in accordance with the output voltage, and the threshold voltage after completing the data write operation decreases toward the lower side ("C"→"C'"). In this case, since a read voltage Vread is generated from the power supply voltage from the first band gap reference circuit BGR1, which has no temperature characteristics, the read voltage Vread is constant in FIG. 15A and FIG. 15B. Consequently, a margin voltage ΔVth1 between the verify voltage Vverify1 and read voltage Vread decreases, and erroneous data read and data read delay will occur.

On the other hand, at the time of the verify read operation according to this example, as shown in FIG. 15B, the verify read can be executed by the first output voltage VREF1 which is constant with no temperature characteristics. Accordingly, the verify voltage Vverify2 can be set constant with no temperature characteristics in accordance with the output voltage VREF1. Therefore, the threshold distribution for the "00" state ("C") can be set in a predetermined range. As a result, since a margin voltage ΔVth2 between the verify voltage Vverify2 and read voltage Vread can be retained, erroneous data read and data read delay can be prevented.

As has been described above, the verify read operation is executed by switching the power supply voltage to the first output voltage VREF1 (>VREF2) that is higher than the second output voltage VREF2 on the low temperature side. Thus, the margin voltage can be retained.

Transition Time from Verify Read Operation Time to Data Write Operation Time

Next, referring to FIG. 16, a description is given of the transition time from the verify read operation time to the data write operation time. In FIG. 16, a solid line 61 indicates the transition time from the verify read operation time to the data write operation time in the present example. On the other hand, a broken line 62 indicates a transition time in a case where only one band gap reference circuit BGR is provided and the resistance ratio is switched.

As indicated by the solid line 61 in FIG. 16, at time point t1, the verify read operation by a word line voltage (VWL_verify), which is generated from the first output voltage VREF1, is completed.

Then, at time point t2 after a time ΔTch1, the operation transitions to the data write operation by a word line voltage (VWL_pgm) which is generated from the second output voltage VREF2.

On the other hand, in the case of the broken line 62, at time point t3 after a time ΔTch2 (>ΔTch1), the operation transitions, at last, to the data write operation by the word line voltage (VWL_pgm). In the case of this example, if the time constant of the circuit is taken into account, ΔTch1 is, e.g. about several-hundred ns, and ΔTch2 is, e.g. about several to several-ten μs. Thus, in the case of this example, the transition time can be reduced by the order of magnitude or more.

As has been described above, according to the present embodiment, compared to the case in which only one band gap reference circuit BGR is provided, the transition time from the verify time operation time to the data write operation time can advantageously be reduced (ΔTch1<ΔTch2).

The reason for this is that in the present embodiment the power supply circuit 41 includes two band gap reference circuits BGR1 and BGR2, and the verify read operation time can be transitioned to the data write operation time in the state in which each of the two amplifiers amp1 and amp2 in the power supply circuit 41 is driven.

In this embodiment, the description has been given of the transition time from the verify read operation time to the data write operation time. However, the same applies to the case of the reverse transition. That is, the invention is similarly applicable to the transition from the data write operation time to the verify read operation time, and the same advantageous effects can be obtained.

3. Advantageous Effects of the First Embodiment

As has been described above, according to the semiconductor memory device of the first embodiment, at least the following advantageous effects (1) to (5) can be obtained.

(1) Over-program can be prevented and the write time can be decreased.

As described above, the semiconductor memory device according to the present embodiment comprises the memory cell array 10 which includes a plurality of memory cells arranged in a matrix at intersections between a plurality of word lines WL and a plurality of bit lines BL; and the power supply circuit 41 which includes the first band gap reference circuit BGR1 which outputs the first output voltage VREF1, and the second band gap reference circuit BGR2 which outputs the second output voltage VREF2 (<VREF1) having lower temperature characteristics than the first output voltage on the low temperature side, the power supply circuit 41 generating a power supply voltage on the basis of the second output voltage VREF2 at the time of the data write operation of the memory cell MC.

The temperature characteristics of the output voltages VREF1 and VREF2 of the first and second band gap reference circuits BGR1 and BGR2 are as shown in FIG. 12. As shown in FIG. 12, the output voltage VREF1 of the first band gap reference circuit BGR1 is constant (const) relative to temperatures. On the other hand, the output voltage VREF2 of the second band gap reference circuit BGR2 has the positive gradient α and has lower temperature characteristics than the first output voltage VREF1 on the low temperature side. For example, at about −40° C., the second output voltage VREF2 is lower than the first output voltage VREF1 by about ΔVREF. Similarly, at about a room temperature (about 20° C.), the second output voltage VREF2 is lower than the first output voltage VREF1. On the high temperature side (about 85° C.), the values of the output voltages VREF1 and VREF2 cross each other. Accordingly, on the high temperature side, the second output voltage VREF2 becomes higher than the first output voltage VREF1.

According to the above-described structure, at the time of the data write operation, with the power supply voltage that is based on the second output voltage VREF2 (<VREF1) which is lower than the first output voltage VREF1 on the low temperature side, data write can be executed with such a voltage relationship that the gate voltage and drain voltage, which are applied to the selected memory cell, are lowered. Thus, even in the case where on the low temperature side, the variation of the threshold value of the selected memory cell MC increases and the cell write speed becomes higher, data write can be executed with in accordance with the characteristics of the cell in which the write speed is high, and over-program can be prevented. In other words, when data write is executed, the write voltage of the memory cell is made lower at the time of low temperatures than at the time of high temperatures. Thereby, the write operation can be made uniform so as to cancel the variation in the threshold value.

On the other hand, at the time of the verify read operation, the power supply voltage is switched from the second output voltage VREF2 to the first output voltage VREF1 which is constant with no temperature characteristics.

Accordingly, as shown in FIG. 15B, the verify voltage can be set constant with no temperature characteristics in accordance with the output voltage VREF1. Therefore, the threshold distribution for the "00" state ("C") can be set in a predetermined range.

As a result, since a margin voltage between the verify voltage and the read voltage can be retained, erroneous data read and data read delay can be prevented.

As has been described above, according to the semiconductor memory device of this embodiment, there is the advantage that over-program can be prevented and the margin voltage between the verify voltage and the read voltage can be retained.

(2) Multi-value programming can advantageously be achieved.

As has been described above, the verify read in this embodiment is executed by switching the power supply voltage to the first output voltage VREF1 which is constant with no temperature characteristics.

Accordingly, as shown in FIG. 15B, the margin voltage ΔVth2 between the verify voltage Vverify2 and read voltage Vread can be retained.

When multi-value program is executed, the number of threshold voltages of the memory cell increases, and it is necessary to finely control the threshold distribution. In the present embodiment, the margin voltage ΔVth2 can be retained, therefore, multi-value programming can advantageously be achieved.

(3) The manufacturing cost can advantageously be reduced.

If the circuit structure as in the present example, which is usable in the switching from the data write operation to the verify read operation, is to be realized by a single band gap reference circuit BGR, the power supply voltage itself is made different. Consequently, the setting of the resistance division (R4 to R6) of the gate voltage/drain voltage regulator circuits RG_gate and RG_drain has to be altered, and the control becomes complex.

However, according to the structure of the second band gap reference circuit of the present example, as shown in FIG. 10, the resistance value of the resistor RL is adjusted by setting the resistance ratio between the resistor elements R1b and R2b. Thereby, it is possible to perform the setting which satisfies the condition for such desirable temperature characteristics as to become lower than the output voltage VREF1 on the low temperature side.

Therefore, the manufacturing cost can advantageously be reduced in that the design alteration is easy.

(4) The reliability is advantageously enhanced.

As shown in FIG. 14, at the time of the switching timing between the data write operation and the verify read operation in the present embodiment, the switching circuit 42 provides the predetermined times ΔT1 and ΔT2 at which both the switching signals "enable" and "disable" are set in the "L" level. Thus, during the time ΔT1, ΔT2, the two amplifiers amp1 and amp2 in the power supply circuit 41 are turned off at the same time. Thereby, fluctuations of the outputs of the amplifiers amp1 and amp2 are prevented, and the voltage on the word line WL and bit line BL can be stabilized, and in this respect the reliability is advantageously enhanced.

(5) The transition time can advantageously be reduced.

The power supply circuit 41 according to the present embodiment includes the two band gap reference circuits BGR1 and BGR2. Further, the verify read operation time can be transitioned to the data write operation time in the state in which each of the two amplifiers amp1 and amp2 in the power supply circuit 41 is driven.

Thus, as shown in FIG. 16, compared to the case (broken line 62) in which only one band gap reference circuit BGR is provided, the transition time from the verify time operation time to the data write operation time can advantageously be reduced (ΔTch1<ΔTch2). In addition, the same applies to the case of the reverse transition, that is, the transition from the data write operation time to the verify read operation time, and the same advantageous effects can be obtained.

Second Embodiment

An Example in which the Dependency of the Output Voltage Upon the Power Supply Voltage is Prevented Next, referring to FIG. 17 to FIG. 20, a semiconductor memory device according to a second embodiment of the invention is described. The second embodiment relates to an example in which the output voltage VREF of the band gap reference circuit is prevented from depending on the power supply voltage VDD. In this description, a detailed description of the parts which are common to those in the first embodiment is omitted.

4. Dependency of VREF2 upon Power Supply Voltage

To begin with, referring to FIG. 17, a description is given of the dependency of the second output voltage VREF2 of the second band gap reference circuit BGR2 (hereinafter referred to as "BBGR type") upon the power supply voltage VDD.

Figure 17:
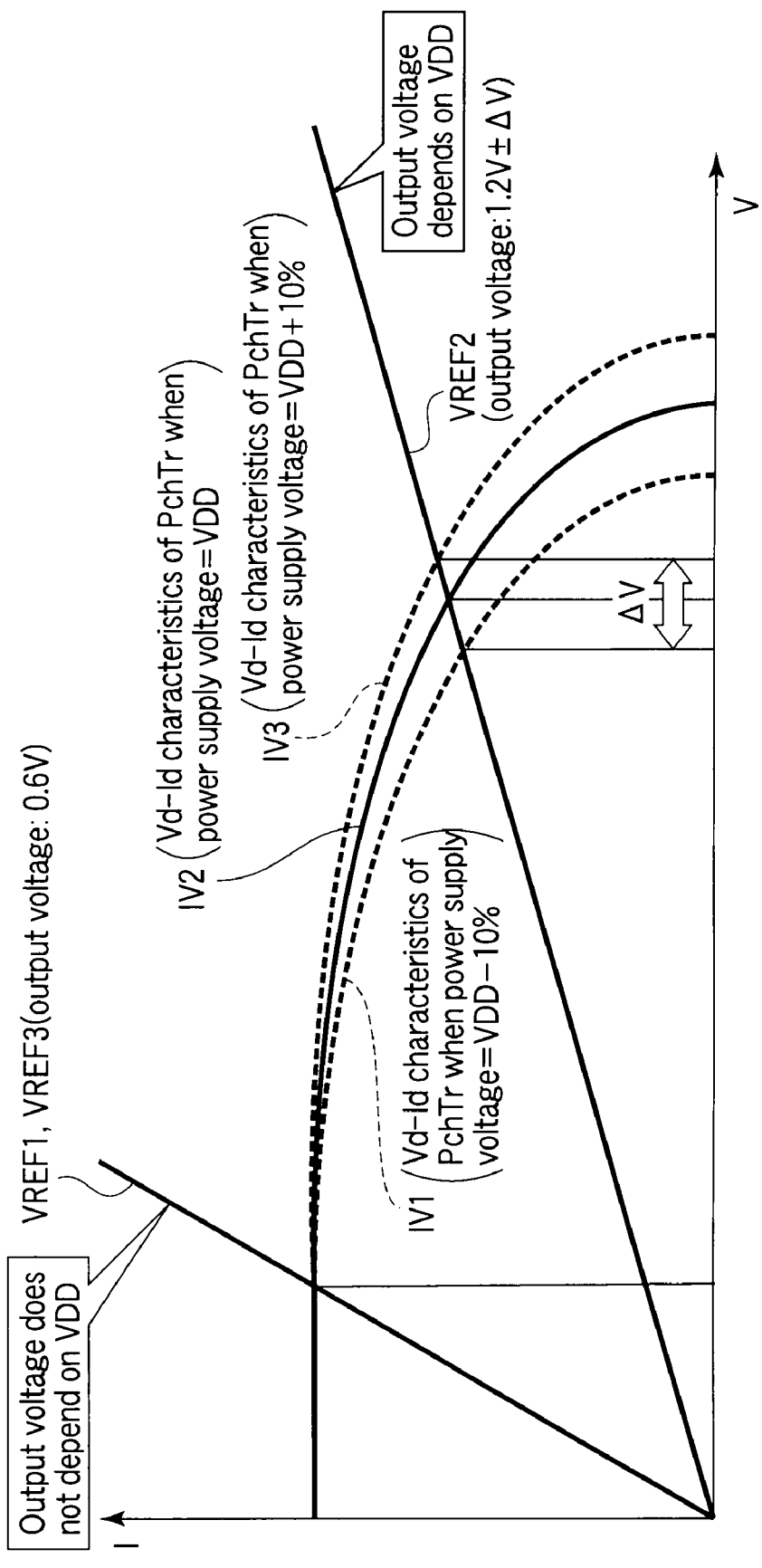
FIG. 17 is a graph showing the power supply voltage dependency of VREF2 according to a second embodiment of the invention.

In FIG. 17, VREF1 and VREF3 are output voltages of the first and third band gap reference circuits BGR1 and BGR3, and VREF2 is an output voltage of the second band gap reference circuit BGR2. In addition, in FIG. 17, IV1 is Vd-Id characteristics of the Pch transistors P1$b$ to P3$b$ in the BGR2 at a time of power supply voltage VDD−10%. IV2 is Vd-Id characteristics of the Pch transistors P1$b$ to P3$b$ in the BGR2 at a time of power supply voltage VDD. IV3 is Vd-Id characteristics of the Pch transistors P1$b$ to P3$b$ in the BGR2 at a time of power supply voltage VDD+10%.

As shown in FIG. 17, the output voltages VREF1 and VREF3 of the first and third band gap reference circuits BGR1 and BGR3 do not depend on the power supply voltage VDD. Accordingly, the output voltages VREF1 and VREF3, which are desirable voltages of about 0.6 V, can be obtained.

However, the output voltage VREF2 of the second band gap reference circuit BGR2 depends on the power supply voltage VDD. Thus, the output voltage VREF2 (1.2±ΔV), which deviates from a desirable voltage of about 1.2 V by about ΔV, may occur.

For example, as indicated by characteristic lines IV1 to IV3, if the internal power supply voltage deviates by about ±10%, the voltage, which is applied to a triode region (control electrode region) of the Pch transistors P1$b$ to P3$b$ in the second band gap reference circuit BGR2, also deviates. Consequently, the output voltage VREF2 may have voltage characteristics which depend on the internal power supply voltage VDD.

The description of the second embodiment, which will be given below, is directed to an example in which even if a variance occurs in the internal power supply voltage VDD, it is possible to prevent the output voltage of the band gap reference circuit from depending on the power supply voltage VDD, and to output a constant value.

5. Structure Example of Voltage Generating Circuit 21

Figure 18:
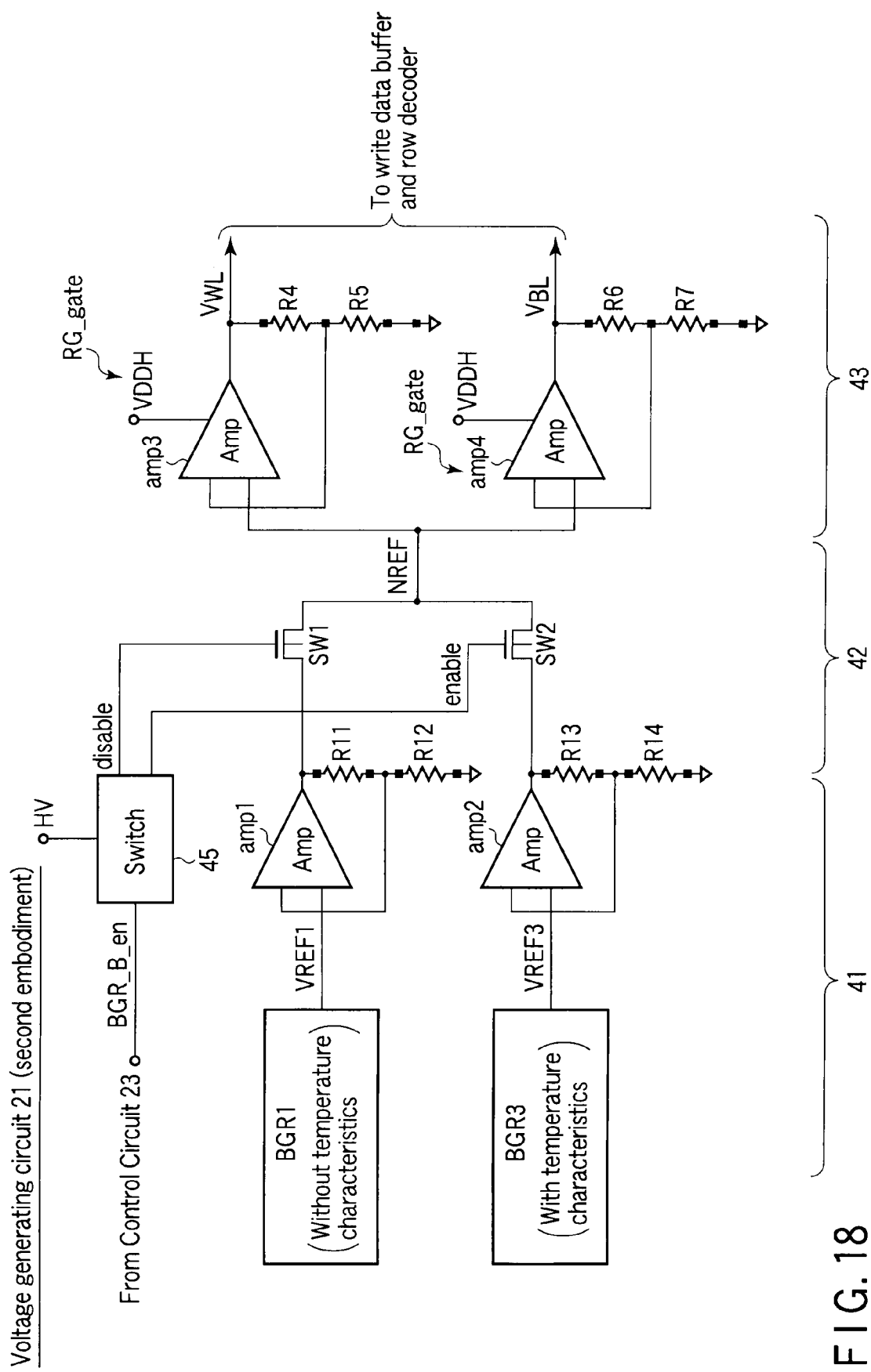
FIG. 18 is a block diagram showing a voltage generating circuit which is included in a semiconductor memory device according to the second embodiment.

Next, referring to FIG. 18, a description is given of a structure example of the voltage generating circuit 21 which is included in the semiconductor memory device according to the second embodiment.

5-1.

As shown in FIG. 18, the voltage generating circuit 21 according to the second embodiment differs from the voltage generating circuit according to the first embodiment in the following respects.

The voltage generating circuit 21 according to the second embodiment includes a third band gap reference circuit BGR3 having temperature characteristics. The details of the third band gap reference circuit BGR3 will be described later.

In addition, a voltage, which is resistor-divided by resistor elements R11 and R12, is input to a first input terminal of the amplifier amp1, and a voltage, which is resistor-divided by resistor elements R13 and R14, is input to a first input terminal of the amplifier amp2. This structure aims at canceling the difference between the output voltages of the first and third band gap reference circuits BGR1 and BGR3 by varying the resistance ratio of the regulator amplifiers amp1 and amp3.

Specifically, one end of the resistor element R11 is connected to the output of the amplifier amp1, and the other end of the resistor element R11 is connected to a first input terminal of the amplifier amp1. One end of the resistor element R12 is connected to the other end of the resistor element R11, and the other end of the resistor element R12 is connected to a ground power supply. One end of the resistor element R13 is connected to the output of the amplifier amp2, and the other end of the resistor element R13 is connected to a first input terminal of the amplifier amp2. One end of the resistor element R14 is connected to the other end of the resistor element R13, and the other end of the resistor element R14 is connected to the ground power supply.

The other structure is common to the first embodiment, so a detailed description thereof is omitted.

5-2. Structure Example of Third Band Gap Reference Circuit BGR3

Figure 19:
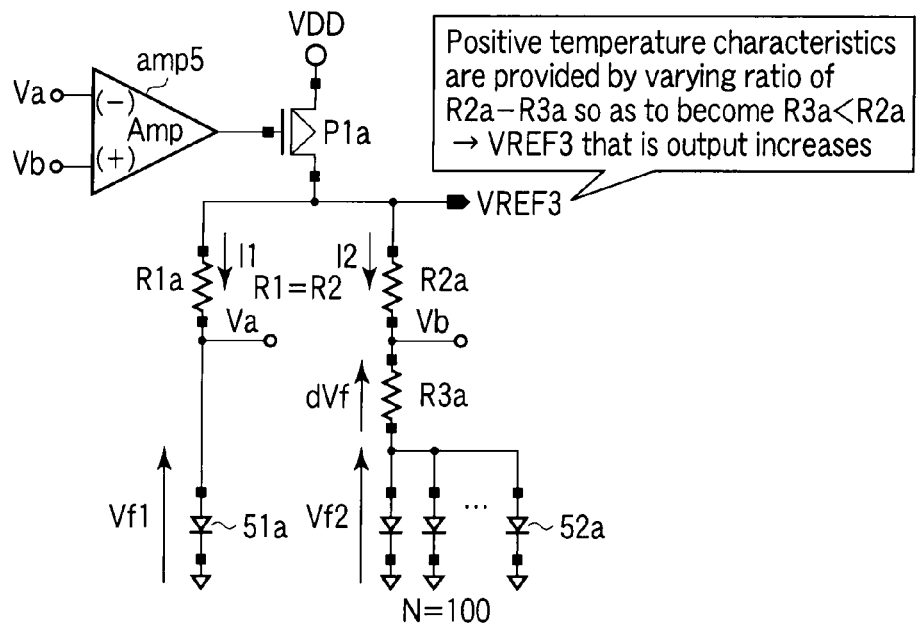
FIG. 19 is an equivalent circuit diagram showing a third band gap reference circuit in FIG. 18.

Next, with reference to FIG. 19, a description is given of a structure example of the third band gap reference circuit BGR3.

As shown in FIG. 19, the third band gap reference circuit BGR3 according to the second embodiment differs from the first band gap reference circuit BGR1 in that the resistance value of the resistor element R3$a$ is lower than the resistance value of the resistor element R2$a$ (resistance values: R3$a$<R2$a$).

In this manner, by varying the resistance ratio of the resistor elements R2$a$ and R3$a$, an output voltage VREF3 having positive temperature characteristics can be generated. This is clear from the above-described equation (2):

$$dVREF1/dT = dVf1/dT + (k/q)\cdot(R2a/R3a)\ln(N) \qquad \text{equation (2)}$$

To be more specific, as will be described later, the output voltage VREF3 in this embodiment is higher than the output voltage VREF1. Unlike the second band gap reference circuit BGR2, the third band gap reference circuit BGR3 has the same operation point as the first band gap reference circuit BGR1 with respect to the circuit configuration, and the third band gap reference circuit BGR3 has no dependency of the output voltage upon the internal power supply VDD.

5-3. Temperature Dependency of Output Voltage VREF3

Figure 20:
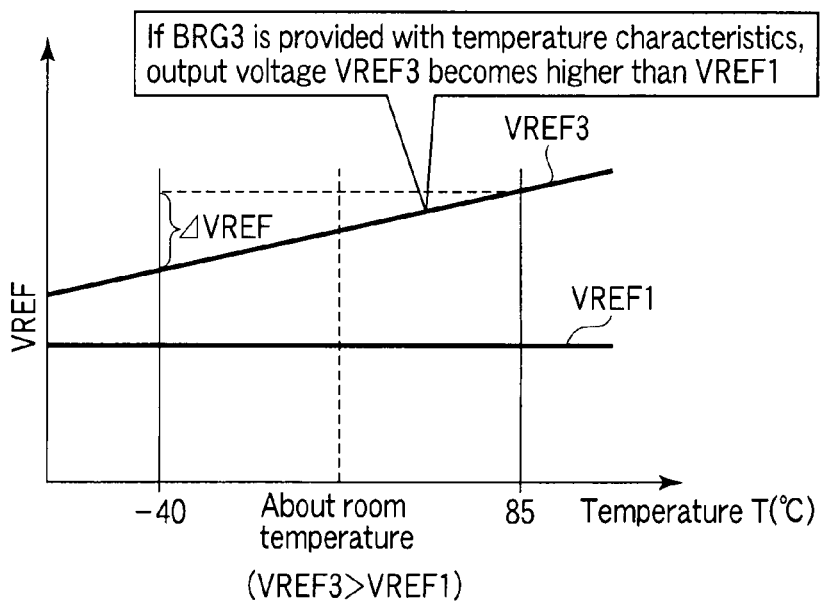
FIG. 20 shows temperature characteristics of the third band gap reference circuit in FIG. 18.

Next, referring to FIG. 20, a description is given of the temperature dependency of the output voltage VREF3 of the third band gap reference circuit BGR3.

As shown in FIG. 20, the output voltage VREF1 of the first band gap reference circuit BGR1 is constant (const) in relation to temperatures. On the other hand, the third output voltage VREF3 of the third band gap reference circuit BGR3 has a positive gradient $\Delta$VREF, and has higher temperature characteristics than the first output voltage VREF1 over the range from the low temperature side to the high temperature side. In this example, over the range from about −40° C. to about a room temperature (about 20° C.) to the high temperature side (about 85° C.), the third output voltage VREF3 has higher temperature characteristics than the first output voltage VREF1.

6. Data Write Operation

In the above-described structure, a voltage NREF, which is a reference voltage of the regulator circuit 43, is obtained by switching, by means of switches SW1 and SW2, an output (VREF1_amp1) of the regulator amp1, which belongs to the BGR1 having no temperature characteristics, and an output (VREF3_amp2) of the regulator amp2, which belongs to the BGR3 having positive temperature characteristics. The resistor elements R11, R12, R13 and R14 in FIG. 18 are adjusted so that the temperature-voltage characteristics of the outputs VREF1_amp1 and VREF3_amp2 may become equal to the temperature-voltage characteristics in FIG. 2 (VREF1_amp1 is VREF1, and VREF3_amp2 is VREF2).

In the above-described structure, at the time of the data write operation, with the output of the regulator amp2 which is associated with the third output voltage VREF3, data write is executed with such a voltage relationship that the gate voltage and drain voltage, which are applied to selected memory cells, are lowered.

Thus, even in the case where on the low temperature side and high temperature side, the variation of the threshold value of the memory cell increases and the cell write speed becomes higher, data write can be executed with a low voltage in accordance with the characteristics of the cell, and overprogram can be prevented. In other words, when data write is executed, the write voltage of the memory cell is made lower at the time of low temperatures than at the time of high temperatures. Thereby, the threshold variation can be canceled, and the write operation can be made uniform.

7. Advantageous Effects of the Second Embodiment

As has been described above, according to the semiconductor memory device of the second embodiment, at least the same advantageous effects (1), (2), (4) and (5) as described above can be obtained. Furthermore, according to the structure of the semiconductor memory device of this embodiment, at least the following advantageous effect (6) can be obtained.

(6) Even when the power supply voltage varies, a desired output voltage VREF can be output.

The semiconductor memory device according to this embodiment includes the third band gap reference circuit BGR3 having temperature characteristics. In addition, a voltage, which is resistor-divided by resistor elements R11 and R12, is input to the first input terminal of the amplifier amp1, and a voltage, which is resistor-divided by resistor elements R13 and R14, is input to the first input terminal of the amplifier amp2. This structure aims at canceling the difference between the output voltages of the first and third band gap reference circuits BGR1 and BGR3 by varying the resistance ratio of the regulator amplifiers amp1 and amp3.

Therefore, as shown in FIG. 17, even in the case where power supply voltage VDD varies, desired output voltages VREF1 and VREF3 with no voltage characteristics can be output.

Moreover, the resistor-divided voltages of the resistor elements R11 and R12 and resistor elements R13 and R14 are fed back to the first input terminals of the amplifiers amp1 and amp2. Therefore, there is a merit that the switching speed is high.

[Modification 1]

Next, referring to FIG. 21, a semiconductor memory device according to modification 1 is described. A detailed description of the parts which are common to those in the above-described second embodiment is omitted.

<Structure Example of Voltage Generating Circuit 21>

As shown in FIG. 21, a voltage generating circuit 21 according to modification 1 is different from the voltage generating circuit according to the second embodiment in that the voltage generating circuit 21 includes resistor elements R15 to R17 and switching elements SW11 to SW14. In other words, the former differs from the latter in that voltages, which are resistor-divided by the resistor elements R15 to R17, are switched by the switching elements SW11 to SW14 and are input to the amplifiers amp1 and amp2.

The resistor elements R15 to R17 are connected in series, at one end and the other end thereof, between the node NREF and the ground power supply.

One end of the current path of the switching element SW11 is connected to the output of the amplifier amp1, the other end of the current path of the switching element SW11 is connected to the node NREF, and the control terminal of the switching element SW11 is supplied with the switching signal (disable). One end of the current path of the switching element SW12 is connected to the output of the amplifier amp2, the other end of the current path of the switching element SW12 is connected to the node NREF, and the control terminal of the switching element SW12 is supplied with the switching signal (enable). One end of the current path of the switching element SW13 is connected to the other end of the resistor element R15, the other end of the current path of the switching element SW13 is connected to the first inputs of the amplifiers amp1 and amp2, and the control terminal of the switching element SW13 is supplied with the switching signal (disable). One end of the current path of the switching element SW14 is connected to the other end of the resistor element R16, the other end of the current path of the switching element SW14 is connected to the first inputs of the amplifiers amp1 and amp2, and the control terminal of the switching element SW14 is supplied with the switching signal (enable).

According to modification 1, at least the same advantageous effects (1) to (6) as described above can be obtained. The structure according to modification 1 is applicable, where necessary.

In addition, the number of resistor elements for resistor-division and feed-back can be made less than in the second embodiment. Therefore, the circuit area can advantageously be reduced.

[Modification 2]

Next, referring to FIG. 22, a semiconductor memory device according to modification 2 is described. A detailed description of the parts which are common to those in the above-described second embodiment is omitted.

<Structure Example of Voltage Generating Circuit 21>

As shown in FIG. 22, a voltage generating circuit 21 according to modification 2 is different from the voltage generating circuit according to the second embodiment in that the voltage generating circuit 21 includes a second band gap reference circuit (BBGR type) BGR2. In this second band gap reference circuit BGR2, the resistance of the resistor R4b shown in FIG. 10 is increased so that the second band gap reference circuit BGR2 has no voltage characteristics. Thus, the output voltage of the BGR2 decreases and fails to satisfy the temperature-voltage characteristics in FIG. 12.

However, the resistor-divided voltages of the resistor elements R11 and R12 and the resistor elements R13 and R14 are input to the first input terminals of the amplifiers amp1 and amp2. This structure aims at canceling the difference between the output voltages of the first and second band gap reference circuits BGR1 and BGR2 by varying the resistance ratio of the regulator amplifiers amp1 and amp2. As a result, the output NREF keeps the relationship of FIG. 12, like modification 1.

According to modification 2, at least the same advantageous effects (1) to (6) as described above can be obtained. The structure according to modification 2 is applicable, where necessary.

[Modification 3]

Next, referring to FIG. 23, a semiconductor memory device according to modification 3 is described. A detailed description of the parts which are common to those in the above-described modification 1 is omitted.

<Structure Example of Voltage Generating Circuit 21>

As shown in FIG. 23, a voltage generating circuit 21 according to modification 3 is different from the voltage generating circuit according to modification 1 in that the voltage generating circuit 21 includes a second band gap reference circuit (BBGR type) BGR2. In this second band gap reference circuit BGR2, the resistance of the resistor R4b shown in FIG. 10 is increased so that the second band gap reference circuit BGR2 has no voltage characteristics. Thus, the output voltage of the BGR2 decreases and fails to satisfy the temperature-voltage characteristics in FIG. 12. The output NREF keeps the relationship of FIG. 12, like modification 1.

According to modification 3, at least the same advantageous effects (1) to (6) as described above can be obtained. The structure according to modification 3 is applicable, where necessary.

[Modification 4]

Figure 24:
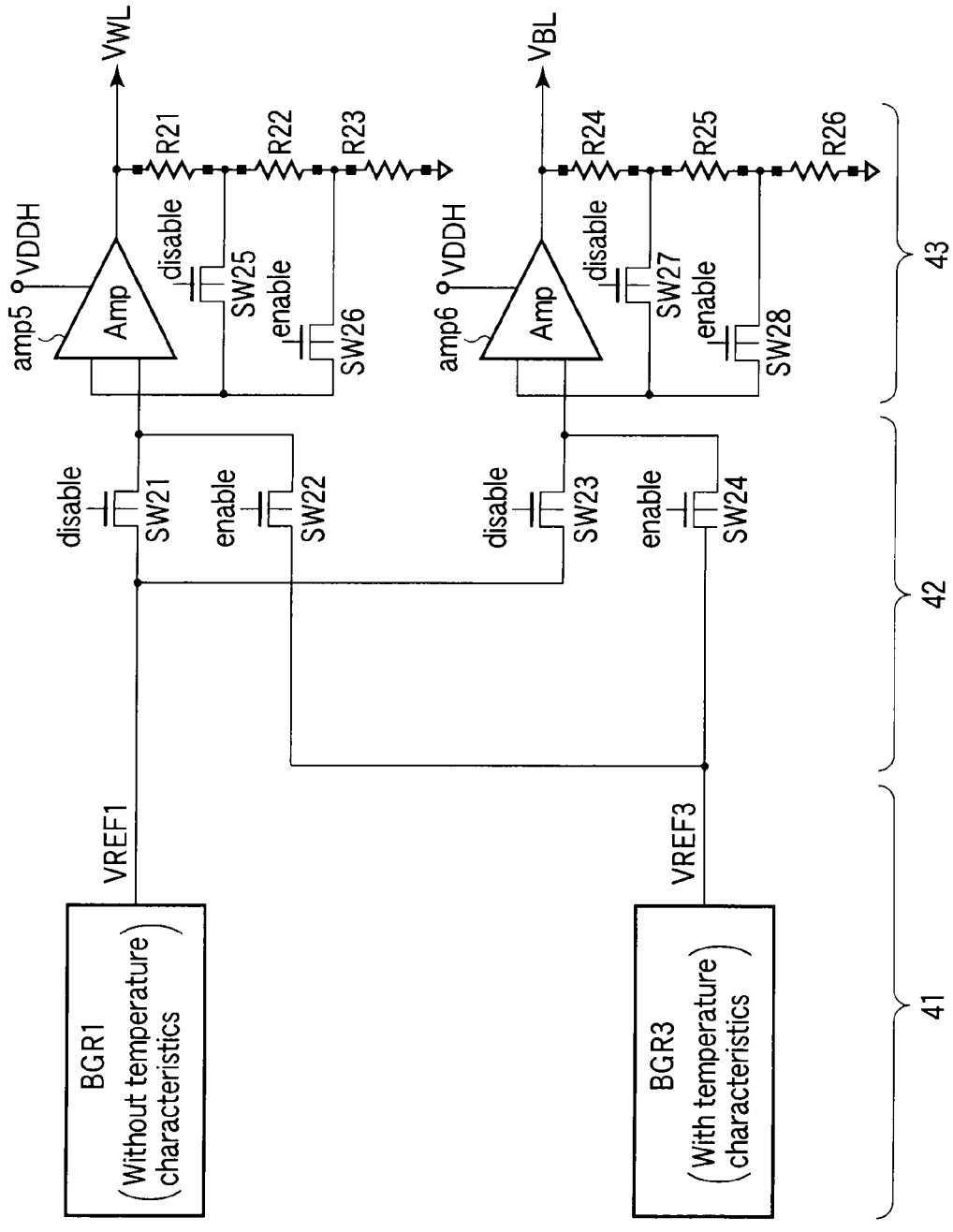
FIG. 24 is a block diagram showing a voltage generating circuit according to modification 4.

Next, referring to FIG. 24, a semiconductor memory device according to modification 4 is described. A detailed description of the parts which are common to those in the above-described second embodiment is omitted.

<Structure Example of Voltage Generating Circuit 21>

As shown in FIG. 24, a voltage generating circuit 21 according to modification 4 is different from the voltage generating circuit according to the second embodiment in that the voltage generating circuit 21 does not include the amplifiers amp1 and amp2 constituting the power supply circuit 41, but includes switching elements SW21 to SW28 and resistor elements R21 to R26. In FIG. 24, depiction of the switching signal generating circuit 45, which generates the switching signals (enable, disable), is omitted.

The power supply circuit 41 does not include the amplifiers amp1 and amp2, but includes the switching elements SW21 to SW24.

One end of the current path of the switching element SW21 is connected to the output of the first band gap reference circuit BGR1, the other end of the current path of the switching element SW21 is connected to the input of the regulator circuit 43, and the control terminal of the switching element SW21 is supplied with the switching signal (disable). One end of the current path of the switching element SW22 is connected to the output of the third band gap reference circuit BGR3, the other end of the current path of the switching element SW22 is connected to the input of the regulator circuit 43, and the control terminal of the switching element SW22 is supplied with the switching signal (enable). One end of the current path of the switching element SW23 is connected to the output of the first band gap reference circuit BGR1, the other end of the current path of the switching element SW23 is connected to the input of the regulator circuit 43, and the control terminal of the switching element SW23 is supplied with the switching signal (disable). One end of the current path of the switching element SW24 is connected to the output of the third band gap reference circuit BGR3, the other end of the current path of the switching element SW24 is connected to the input of the regulator circuit 43, and the control terminal of the switching element SW24 is supplied with the switching signal (enable).

The regulator circuit 43 includes amplifiers amp5 and amp6, switching elements SW25 to SW28 and resistor elements R21 to R26.

The amplifier amp5 is supplied with an internal power supply voltage VDDH. The first input of the amplifier amp5 is connected to the power supply circuit 42, and the second input of the amplifier amp5 is connected to one end of the current path of the switching element SW25 and to one end of the current path of the switching element SW26. The amplifier amp6 is supplied with the internal power supply voltage VDDH. The first input of the amplifier amp6 is connected to the power supply circuit 42, and the second input of the amplifier amp6 is connected to one end of the current path of the switching element SW27 and to one end of the current path of the switching element SW28.

The other end of the current path of the switching element SW25 is connected to the other end of the resistor element R21, and the control terminal of the switching element SW25 is supplied with the switching signal (disable). The other end of the current path of the switching element SW26 is connected to the other end of the resistor element R22, and the control terminal of the switching element SW26 is supplied with the switching signal (enable). The other end of the current path of the switching element SW27 is connected to the other end of the resistor element R24, and the control terminal of the switching element SW27 is supplied with the switching signal (disable). The other end of the current path of the switching element SW28 is connected to the other end of the resistor element R25, and the control terminal of the switching element SW28 is supplied with the switching signal (enable).

The resistor elements R21 to R23 are connected in series, at one end and the other end thereof, between the output of the amplifier amp5 and the ground power supply. The resistor elements R24 to R26 are connected in series, at one end and the other end thereof, between the output of the amplifier amp6 and the ground power supply.

According to modification 4, at least the same advantageous effects (1) to (6) as described above can be obtained. The structure according to modification 4 is applicable, where necessary.

In addition, the power supply circuit 41 according to modification 4 does not require the amplifiers amp1 and amp2, and can be composed of the switching elements SW21 to SW24. Thus, the circuit area can advantageously be reduced.

[Modification 5]

Figure 25:
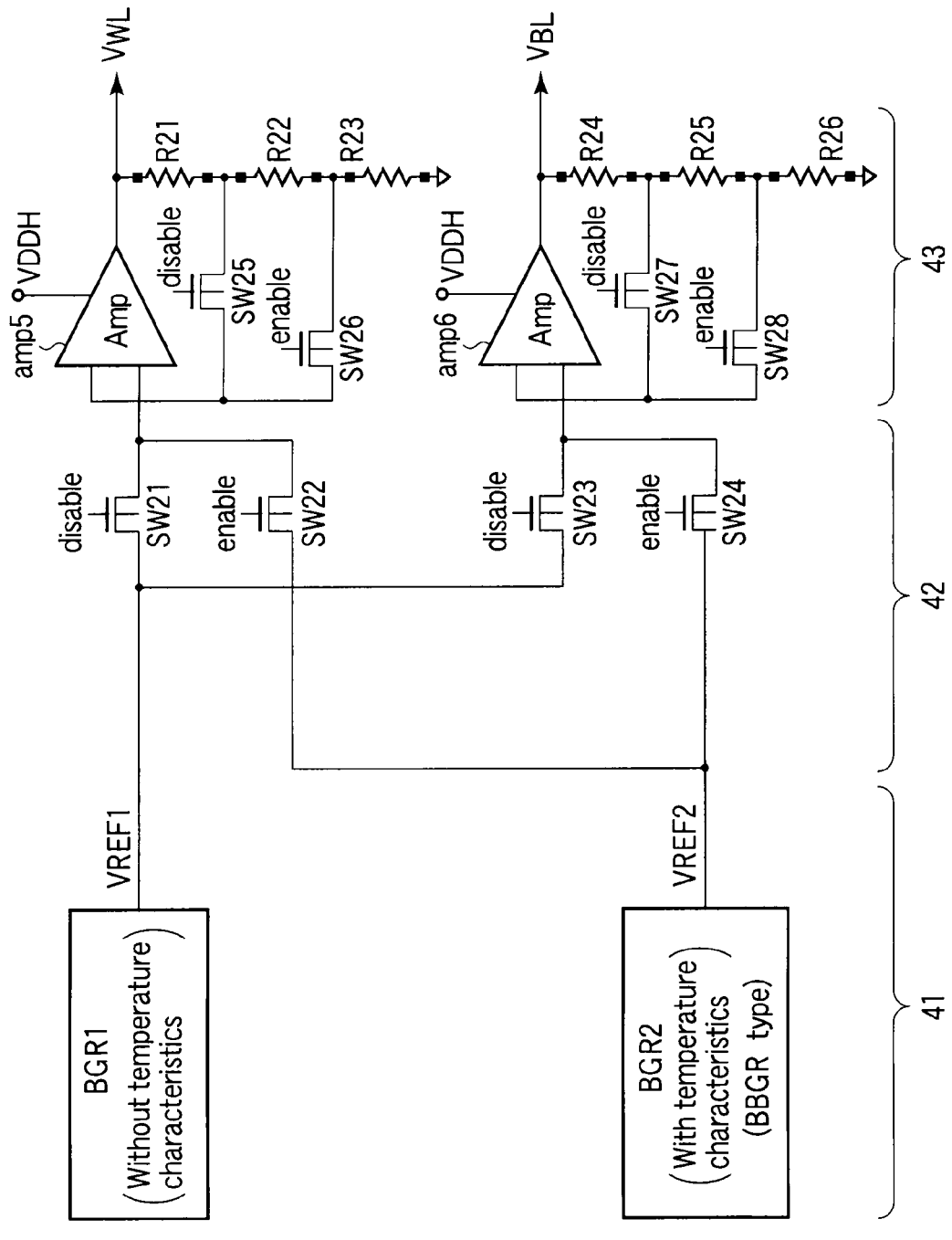
FIG. 25 is a block diagram showing a voltage generating circuit according to modification 5.

Next, referring to FIG. 25, a semiconductor memory device according to modification 5 is described. A detailed description of the parts which are common to those in the above-described modification 4 is omitted.

<Structure Example of Voltage Generating Circuit 21>

As shown in FIG. 25, a voltage generating circuit 21 according to modification 5 is different from the voltage generating circuit according to modification 4 in that the voltage generating circuit 21 includes a second band gap reference circuit (BBGR type) BGR2. In this second band gap reference circuit BGR2, the resistance of the resistor R4b shown in FIG. 10 is increased so that the second band gap reference circuit BGR2 has no voltage characteristics. Thus, the output voltage of the BGR2 decreases and fails to satisfy the temperature-voltage characteristics in FIG. 12.

According to modification 5, at least the same advantageous effects (1) to (6) as described above can be obtained. The structure according to modification 5 is applicable, where necessary.

In the above description, NOR flash memories have been taken as examples of the semiconductor memory device. The present invention, however, is not limited to NOR flash memories. The invention is similarly applicable to other semiconductor memory devices such as a NAND flash memory, an MRAM (Magnetic Random Access Memory), an ReRAM (Resistive RAM), and a PRAM (Phase change Random Access Memory), and the same advantageous effects can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array which includes a plurality of memory cells which are arrayed in a matrix at intersections between a plurality of word lines and a plurality of bit lines; and
   a power supply circuit which includes a first band gap reference circuit which outputs a first output voltage, and a second band gap reference circuit which outputs a second output voltage having lower temperature characteristics than the first output voltage on a low temperature side, and generates a power supply voltage on the basis of the second output voltage at a time of a data write operation of the memory cells.

2. The device according to claim 1, further comprising a control circuit which outputs a control signal; and
   a switching circuit which has an input connected to an output of the power supply circuit, effects switching from the first output voltage to the second output voltage at the time of the data write operation in accordance with the control signal and outputs the second output voltage, and effects switching from the second output voltage to the first output voltage at a time of a verify read operation in accordance with the control signal and outputs the first output voltage.

3. The device according to claim 2, further comprising a regulator circuit which has an input connected to an output of the switching circuit, and outputs a word line voltage and a bit line voltage, which are produced by subjecting an input voltage to standardization.

4. The device according to claim 3, wherein the switching circuit comprises:
   a switching signal generating circuit which is supplied with an internal power supply voltage, and outputs first and second switching signals in accordance with the control signal from the control circuit;
   a first switching element which has a control terminal inputted the first switching signal, and has a current path with one end electrically connected to an output of the first band gap reference circuit and the other end connected to the input of the regulator circuit; and
   a second switching element which has a control terminal inputted the second switching signal, and has a current path with one end electrically connected to an output of the second band gap reference circuit and the other end connected to the input of the regulator circuit.

5. The device according to claim 1, wherein the first output voltage is constant with flat temperature characteristics.

6. The device according to claim 1, wherein temperature characteristics of the second output voltage have a positive gradient.

7. The device according to claim 4, wherein the switching circuit provides, at a switching timing of the data write operation, a time period in which both the first and second switching signals are set in a common level.

8. The device according to claim 4, wherein the switching circuit includes a plurality of resistor elements which are connected, at one end and the other end thereof, in series between the other ends of the first and second switching elements and a ground power supply.

9. The device according to claim 8, wherein the power supply circuit further comprises:
   a first amplifier which has a first input connected to one end of any one of the plurality of resistor elements, a second input connected to the output of the first band gap reference circuit, and an output connected to the one end of the first switching element; and
   a second amplifier which has a first input connected to one end of any one of the plurality of resistor elements, a second input connected to the output of the second band gap reference circuit, and an output connected to the one end of the second switching element.

10. The device according to claim 9, wherein each of the first and second amplifiers is set in an operable state at a transition timing from the verify read operation to the data write operation.

11. A semiconductor memory device comprising:
    a memory cell array which includes a plurality of memory cells which are arrayed in a matrix at intersections between a plurality of word lines and a plurality of bit lines; and
    a power supply circuit which includes a first band gap reference circuit which outputs a first output voltage, and a second band gap reference circuit which outputs a second output voltage having higher temperature characteristics than the first output voltage over a range from a low temperature side to a high temperature side, and generates a power supply voltage on the basis of the first output voltage at a time of a data write operation of the memory cells.

12. The device according to claim 11, further comprising a control circuit which outputs a control signal; and
    a switching circuit which has an input connected to an output of the power supply circuit, effects switching from the second output voltage to the first output voltage at the time of the data write operation in accordance with the control signal and outputs the first output voltage, and effects switching from the first output voltage to the second output voltage at a time of a verify read operation in accordance with the control signal and outputs the second output voltage.

13. The device according to claim 12, further comprising a regulator circuit which has an input connected to an output of the switching circuit, and outputs a word line voltage and a bit line voltage, which are produced by subjecting an input voltage to standardization.

14. The device according to claim 13, wherein the switching circuit comprises:
   a switching signal generating circuit which is supplied with an internal power supply voltage, and outputs first and second switching signals in accordance with the control signal from the control circuit;
   a first switching element which has a control terminal inputted the first switching signal, and has a current path with one end electrically connected to an output of the first band gap reference circuit and the other end connected to the input of the regulator circuit; and
   a second switching element which has a control terminal inputted the second switching signal, and has a current path with one end electrically connected to an output of the second band gap reference circuit and the other end connected to the input of the regulator circuit.

15. The device according to claim 11, wherein the first output voltage is constant with flat temperature characteristics.

16. The device according to claim 11, wherein temperature characteristics of the second output voltage have a positive gradient.

17. The device according to claim 14, wherein the power supply circuit comprises:
   first resistor elements which are connected, at one end and the other end thereof, in series between the one end of the first switching element and a ground power supply; and
   second resistor elements which are connected, at one end and the other end thereof, in series between the one end of the second switching element and the ground power supply.

18. The device according to claim 17, wherein the power supply circuit further comprises:
   a first amplifier which has a first input connected to one end of any one of the first resistor elements, a second input connected to the output of the first band gap reference circuit, and an output connected to the one end of the first switching element; and
   a second amplifier which has a first input connected to one end of any one of the second resistor elements, a second input connected to the output of the second band gap reference circuit, and an output connected to the one end of the second switching element.

19. The device according to claim 11, wherein the second band gap reference circuit comprises:
   a first resistor element which has one end connected to an output terminal of the second band gap reference circuit; and
   a second resistor element which has one end connected to the other end of the first resistor element and the other end connected to a ground voltage, a resistance value of the second resistor element being lower than a resistance value of the first resistor element.

* * * * *